(12) United States Patent
Mehandru et al.

(10) Patent No.: US 11,335,807 B2
(45) Date of Patent: May 17, 2022

(54) ISOLATION SCHEMES FOR GATE-ALL-AROUND TRANSISTOR DEVICES

(71) Applicant: INTEL CORPORATION, Santa Clara, CA (US)

(72) Inventors: Rishabh Mehandru, Portland, OR (US); Stephen M. Cea, Hillsboro, OR (US); Biswajeet Guha, Hillsboro, OR (US); Tahir Ghani, Portland, OR (US); William Hsu, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 783 days.

(21) Appl. No.: 16/024,046

(22) Filed: Jun. 29, 2018

(65) Prior Publication Data

US 2020/0006559 A1    Jan. 2, 2020

(51) Int. Cl.
*H01L 29/78* (2006.01)
*H01L 21/761* (2006.01)
*H01L 21/762* (2006.01)
*H01L 29/06* (2006.01)
(Continued)

(52) U.S. Cl.
CPC ........ *H01L 29/7846* (2013.01); *H01L 21/761* (2013.01); *H01L 21/762* (2013.01); *H01L 29/0673* (2013.01); *H01L 29/42392* (2013.01); *H01L 29/6653* (2013.01);
(Continued)

(58) Field of Classification Search
CPC ............ H01L 27/0886; H01L 29/7846; H01L 29/0673; H01L 29/42392; H01L 2029/7858
See application file for complete search history.

(56) References Cited

U.S. PATENT DOCUMENTS 9,653,583 B1    5/2017 Zhao et al.
2014/0103452 A1    4/2014 Chang et al.
2017/0033020 A1    2/2017 Machkaoutsan et al.
(Continued)

OTHER PUBLICATIONS

European Search Report for European Patent Application No. EP19176638.5 dated Dec. 5, 2019, 11 pages.
(Continued)

*Primary Examiner* — Changhyun Yi
(74) *Attorney, Agent, or Firm* — Schwabe, Williamson & Wyatt, P.C.

(57) ABSTRACT

Isolation schemes for gate-all-around (GAA) transistor devices are provided herein. In some cases, the isolation schemes include changing the semiconductor nanowires/nanoribbons in a targeted channel region between active or functional transistor devices to electrically isolate those active devices. The targeted channel region is referred to herein as a dummy channel region, as it is not used as an actual channel region for an active or functional transistor device. The semiconductor nanowires/nanoribbons in the dummy channel region can be changed by converting them to an electrical insulator and/or by adding dopant that is opposite in type relative to surrounding source/drain material (to create a p-n junction). The isolation schemes described herein enable neighboring active devices to retain strain in the nanowires/nanoribbons of their channel regions, thereby improving device performance.

20 Claims, 14 Drawing Sheets

(51) Int. Cl.
*H01L 29/423* (2006.01)
*H01L 29/66* (2006.01)

(52) U.S. Cl.
CPC .... *H01L 29/6681* (2013.01); *H01L 29/66553* (2013.01); *H01L 29/7853* (2013.01)

(56) References Cited

U.S. PATENT DOCUMENTS

2017/0062598 A1\* 3/2017 Seo ................ H01L 29/0669
2017/0133459 A1  5/2017 Pranatharthiharan et al.
2018/0166535 A1  6/2018 Wostyn et al.
2018/0175167 A1  6/2018 Reboh et al.

OTHER PUBLICATIONS

Office Action from European Patent Application No. 19176638.5, dated Nov. 3, 2021, 6 pgs.

\* cited by examiner

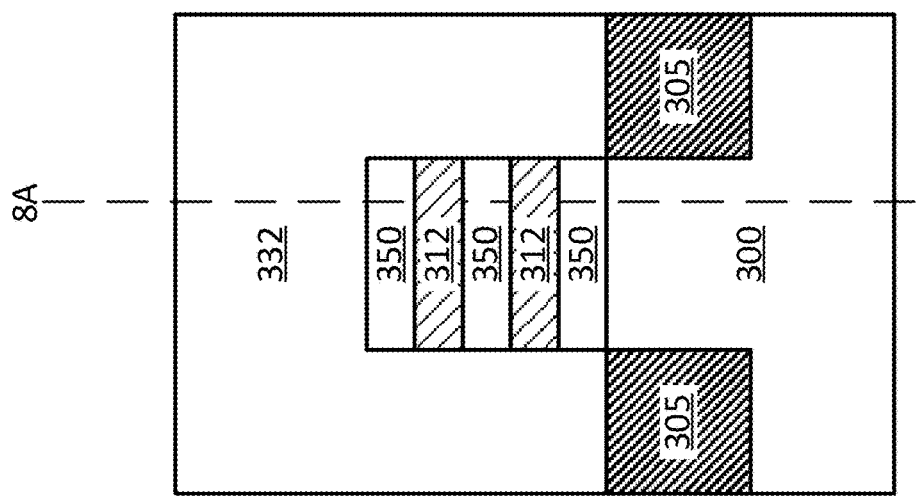
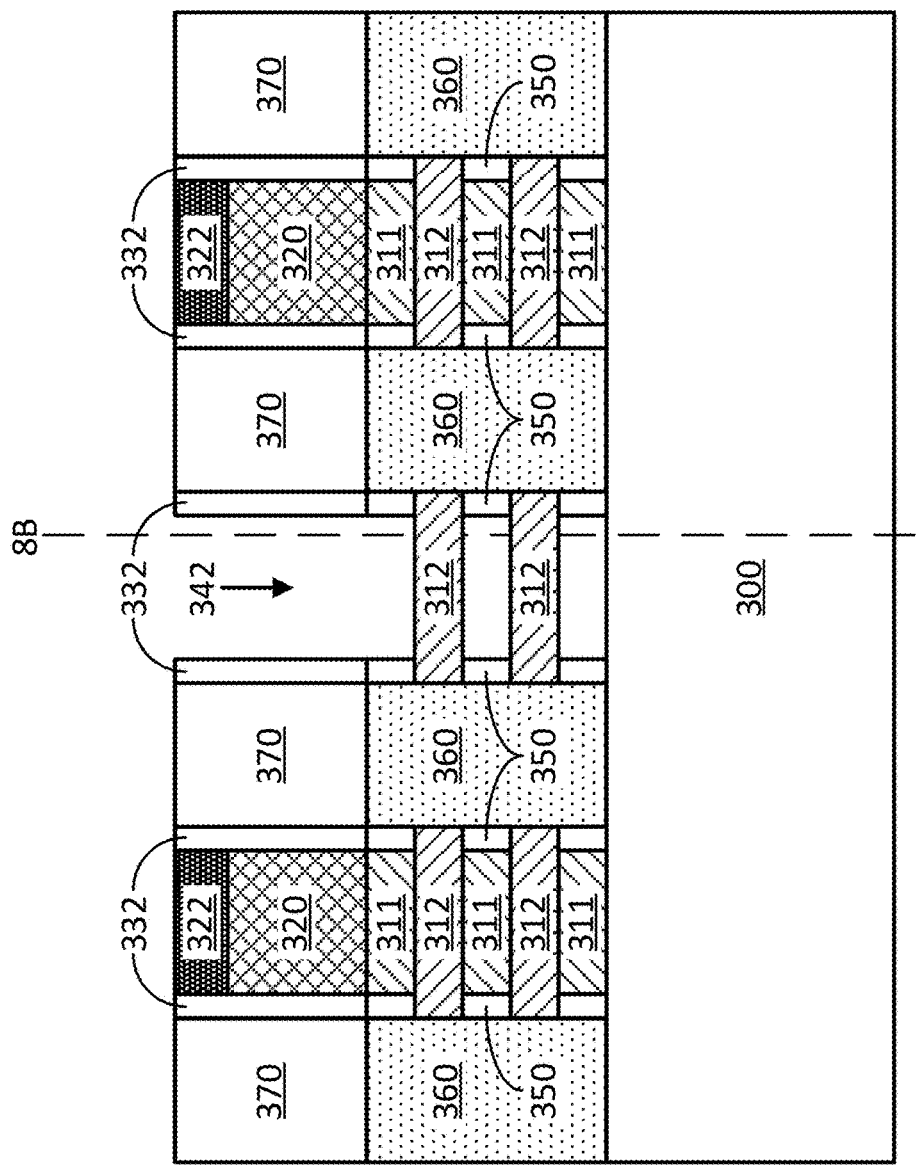
FIG. 8B
FIG. 8A

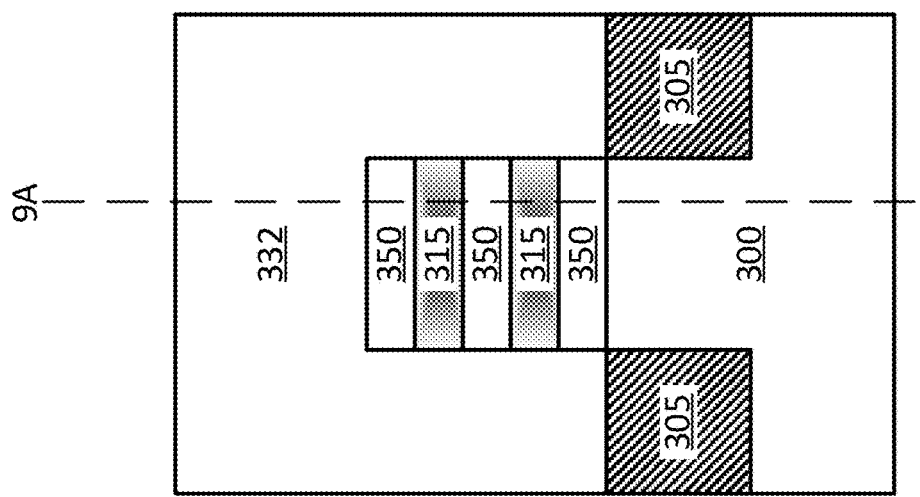
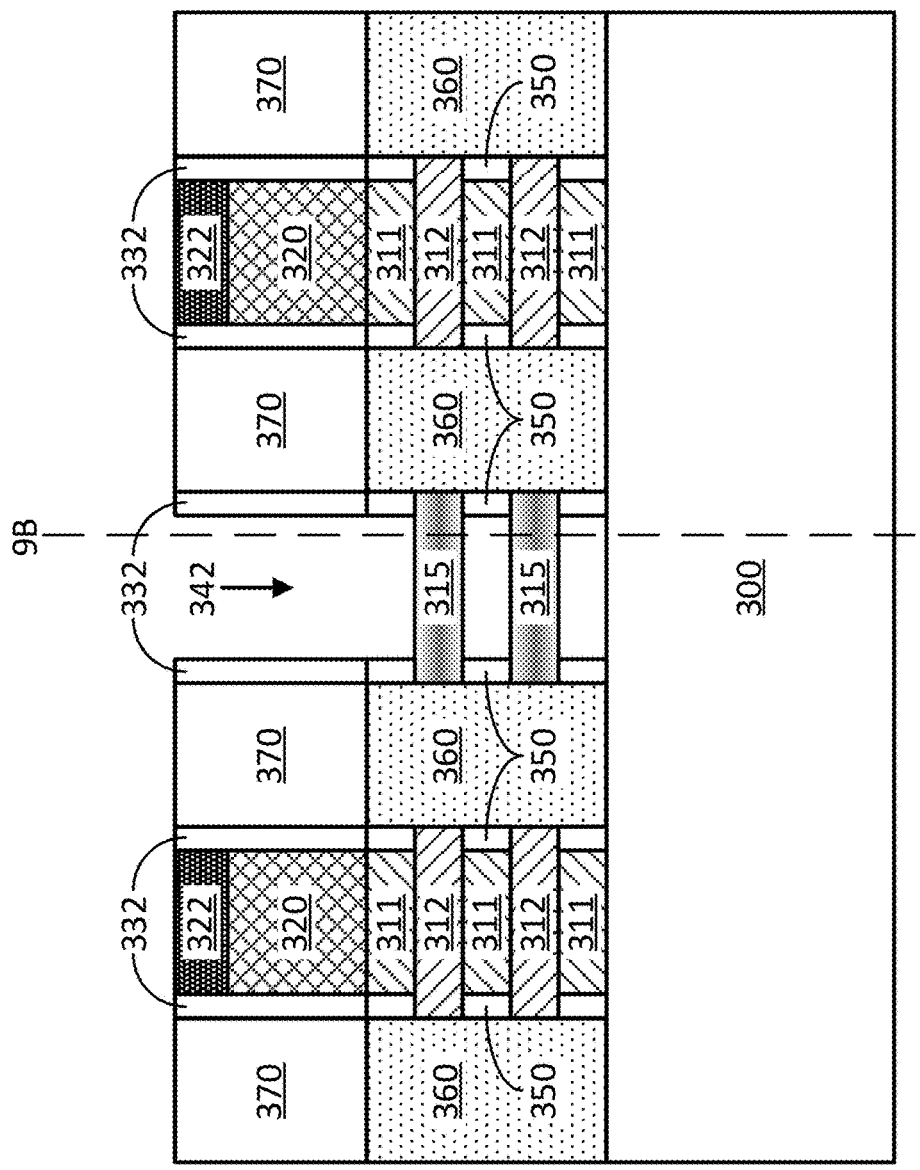
FIG. 9B
FIG. 9A

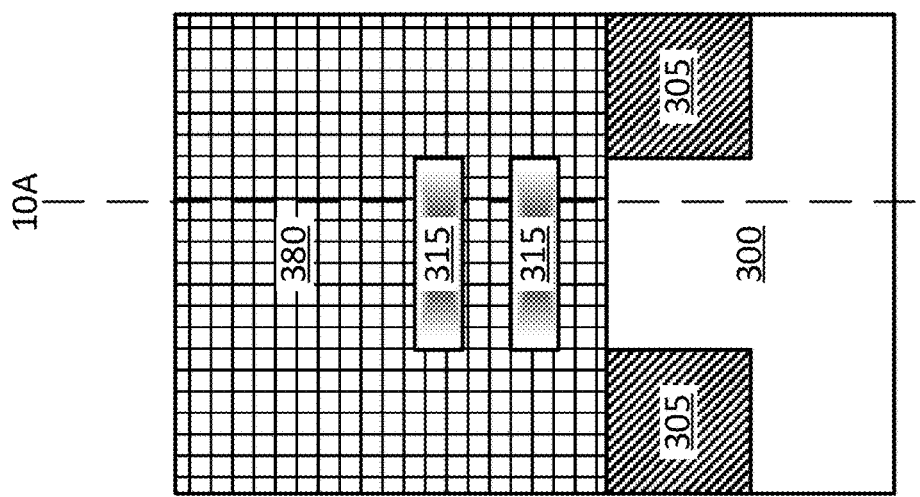
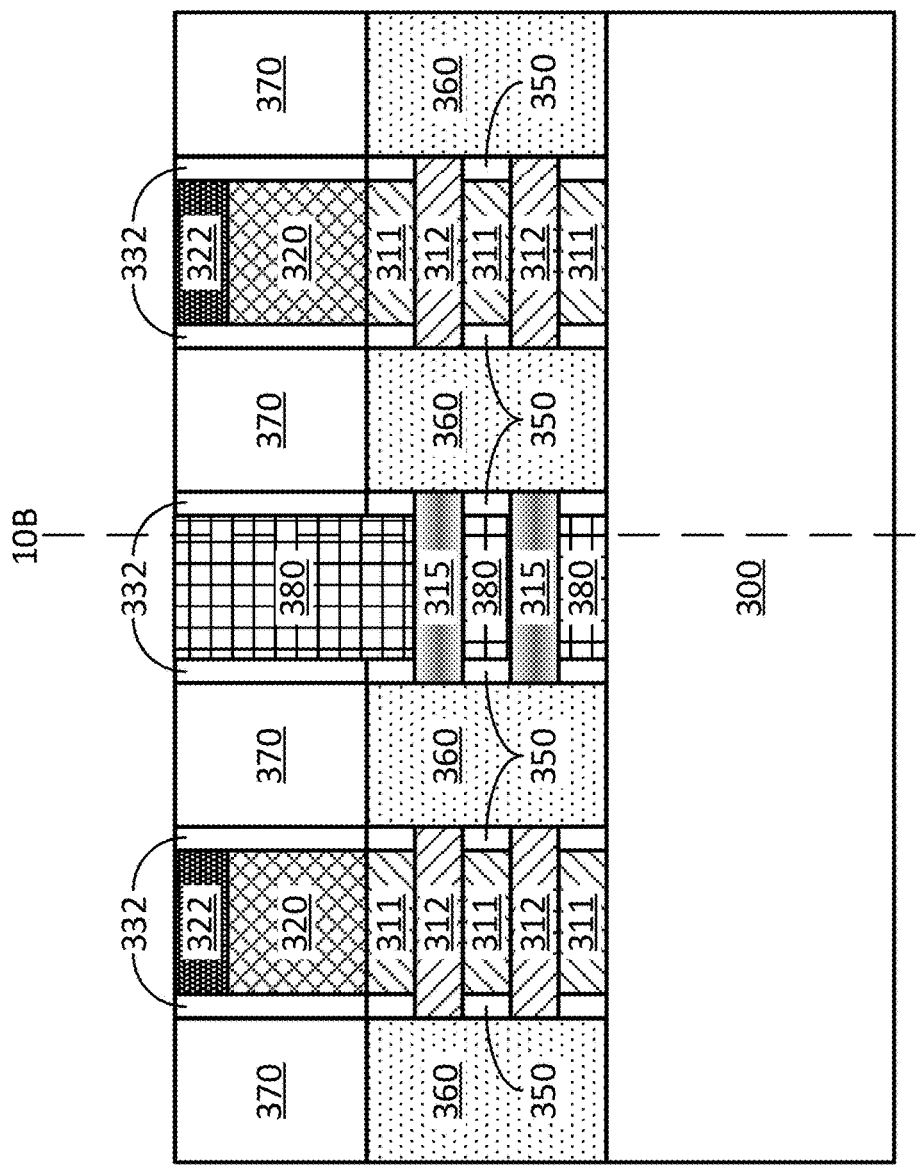
FIG. 10B
FIG. 10A

ISOLATION SCHEMES FOR GATE-ALL-AROUND TRANSISTOR DEVICES

BACKGROUND

Semiconductor devices are electronic components that exploit the electronic properties of semiconductor materials, such as silicon (Si), germanium (Ge), silicon germanium (SiGe) and gallium arsenide (GaAs). A field-effect transistor (FET) is a semiconductor device that includes three terminals: a gate, a source, and a drain. A FET uses an electric field applied by the gate to control the electrical conductivity of a channel through which charge carriers (e.g., electrons or holes) flow between the source and drain. In instances where the charge carriers are electrons, the FET is referred to as an n-channel or n-type device, and in instances where the charge carriers are holes, the FET is referred to as a p-channel or p-type device. Some FETs have a fourth terminal called the body or substrate, which can be used to bias the transistor. In addition, metal-oxide-semiconductor FETs (MOSFETs) include a gate dielectric between the gate and the channel. MOSFETs may also be known as metal-insulator-semiconductor FETs (MISFETSs) or insulated-gate FETs (IGFETs). Complementary MOS (CMOS) structures use a combination of p-channel MOSFET (PMOS) and n-channel MOSFET (NMOS) devices to implement logic gates and other digital circuits.

A FinFET is a MOSFET transistor built around a thin strip of semiconductor material (generally referred to as a fin). The conductive channel of the FinFET device resides on the outer portions of the fin adjacent to the gate dielectric. Specifically, current runs along/within both sidewalls of the fin (sides perpendicular to the substrate surface) as well as along the top of the fin (side parallel to the substrate surface). Because the conductive channel of such configurations essentially resides along the three different outer regions of the fin (e.g., top and two sides), such a FinFET design is sometimes referred to as a tri-gate transistor. Other types of FinFET configurations are also available, such as so-called double-gate FinFETs, in which the conductive channel principally resides only along the two sidewalls of the fin (and not along the top of the fin). A gate-all-around (GAA) transistor, where the channel region includes, for example, one or more nanowires or nanoribbons, is configured similarly to a fin-based transistor, but instead of a finned channel region where the gate is on three portions (and thus, there are three effective gates), the gate material generally wraps around each nanowire or nanoribbon.

BRIEF DESCRIPTION OF THE DRAWINGS

FIG. 8A illustrates the view of FIG. 7A after the middle dummy gate structure (as well as corresponding optional hardmask) was removed to form a trench for the dummy channel region, and the sacrificial layers in the trench were also removed, in accordance with some embodiments.

FIG. 8B illustrates an example cross-sectional view along dashed line 8B shown in FIG. 8A, in accordance with some embodiments. Note that the cross-sectional view of FIG. 8A corresponds to the view taken along dashed line 8A in FIG. 8B.

FIG. 9A illustrates the view of FIG. 8A after the channel material layers in the dummy channel region exposed by the corresponding trench have been changed for electrical isolation purposes to isolation layers or bodies, in accordance with some embodiments.

FIG. 9B illustrates an example cross-sectional view along dashed line 9B shown in FIG. 9A, in accordance with some embodiments. Note that the cross-sectional view of FIG. 9A corresponds to the view taken along dashed line 9A in FIG. 9B.

FIG. 10A illustrates the view of FIG. 9A after an isolation structure has been formed in the dummy channel region trench, in accordance with some embodiments.

FIG. 10B illustrates an example cross-sectional view along dashed line 10B shown in FIG. 10A, in accordance with some embodiments. Note that the cross-sectional view of FIG. 10A corresponds to the view taken along dashed line 10A in FIG. 10B.

Figure 1:
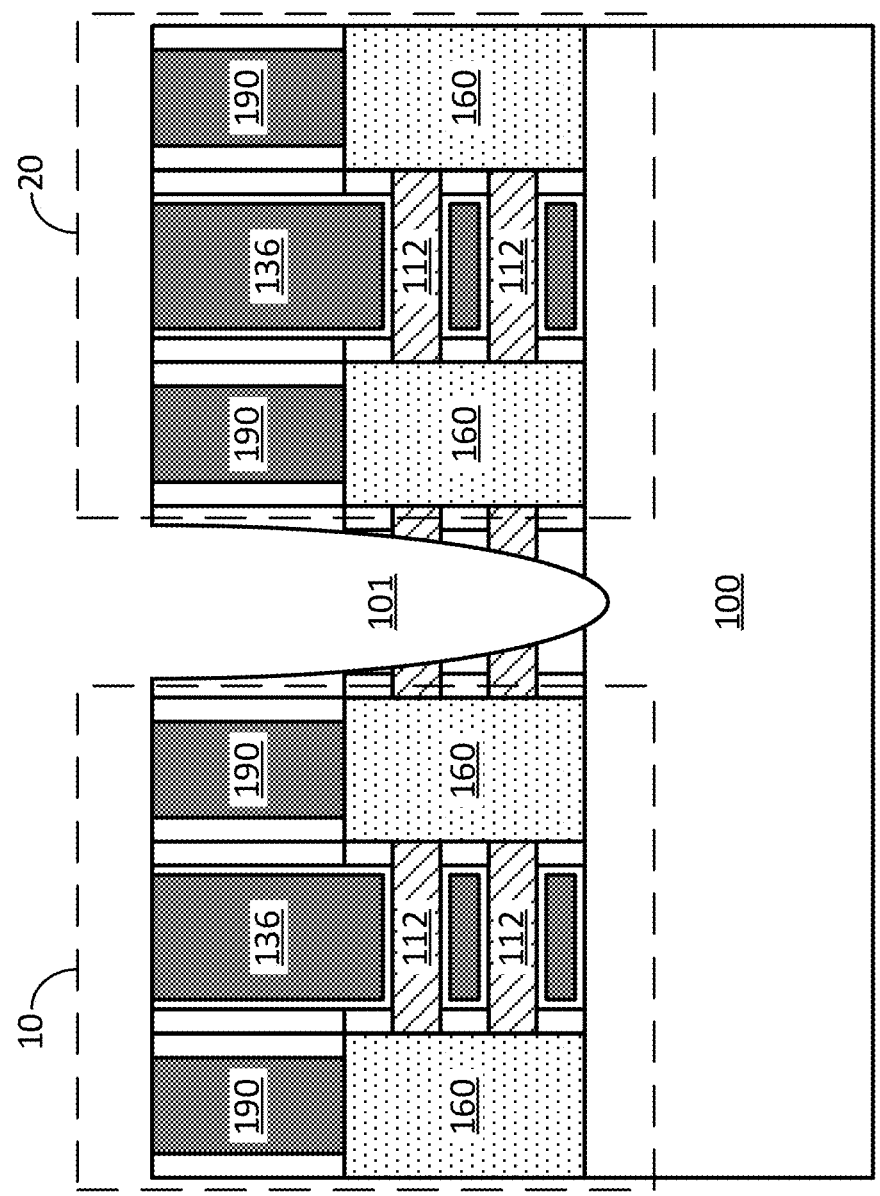
FIG. 1 illustrates an integrated circuit (IC) structure including a first gate-all-around (GAA) transistor electrically isolated from a second GAA transistor by a cut between the two GAA transistors.

These and other features of the present embodiments will be understood better by reading the following detailed description, taken together with the figures herein described. For purposes of clarity, not every component may be labeled in every drawing. Furthermore, as will be appreciated, the figures are not necessarily drawn to scale or intended to limit the described embodiments to the specific configurations shown. For instance, while some figures generally indicate straight lines, right angles, and smooth surfaces, an actual implementation of the disclosed techniques may have less than perfect straight lines and right angles, and some features may have surface topography or otherwise be non-smooth, given real-world limitations of fabrication processes. Further still, some of the features in the drawings may include a patterned and/or shaded fill, which is merely provided to assist in visually identifying distinct features. In short, the figures are provided merely to show example structures.

DETAILED DESCRIPTION

Fabrication of gate-all-around (GAA) transistors that, for example, employ one or more nanowires or nanoribbons face a number of non-trivial issues. In addition, GAA transistor devices are being formed closer and closer to one another keep up with scaling demands. One non-trivial issue faced by GAA transistor devices is electrically isolating the devices or circuits along the same line. For instance, FIG. 1 illustrates an integrated circuit structure including a first GAA transistor 10 electrically isolated from a second GAA transistor 20 by cut 101. As shown, each transistor includes nanowires/nanoribbons 112, gate structure 136, source/drain regions 160, and source/drain contacts 190. The transistors are formed above substrate 100, as shown. As is also shown, cut 101 goes through the dummy channel region to form a resulting trench, such as by etching through the nanowires/nanoribbons of the dummy channel region and then filling the resulting trench with insulator material, for example. However, when cut, the nanowires/nanoribbons relieve any memorized or source/drain stressor enhanced strain, leading to strain relaxation along the line. In other words, the strain relaxation transfers from the cut nanowires/nanoribbons of the dummy channel region in the middle of the depicted structure to adjacent source/drain regions 160, and then transfers to neighboring channel regions that include nanowires/nanoribbons 112. The cutting process used for electrical isolation in the structure of FIG. 1 may result in the nanowires/nanoribbons 112 in directly adjacent transistors 10 and 20 losing up to 80% or more of their previously held stress, and devices farther down the line may also lose stress, for example. This is undesired because strain is employed in transistor channel regions to increase carrier mobility. For instance, tensile strain is employed to increase electron mobility in the channel region (e.g., for NMOS devices), and compressive strain is employed to increase hole mobility in the channel region (e.g., for PMOS devices). Thus, by cutting the nanowires/nanoribbons in a dummy channel region for electrical isolation purposes, it causes undesired relaxation of the strain in neighboring channel regions of active devices, which degrades the performance of those active devices.

Thus, and in accordance with various embodiments of the present disclosure, isolation schemes for gate-all-around (GAA) transistor devices are provided herein. In some embodiments, the isolation scheme includes changing the semiconductor nanowires/nanoribbons in a targeted channel region between active or functional transistor devices to electrically isolate those active devices. The targeted channel region is referred to herein as a dummy channel region, as it will not be used as an actual channel region for an active or functional transistor device. The semiconductor nanowires/nanoribbons in the dummy channel region can be changed by converting them to an electrical insulator and/or by adding dopant that is opposite in type relative to surrounding source/drain material. In such embodiments, the change is performed after the sacrificial layers in the dummy channel region have been removed via selective etch to release what would have otherwise been the channel material layers (if they were not targeted to be changed for electrical isolation purposes).

As can be understood based on this disclosure, by not cutting or removing those original nanowires/nanoribbons in the dummy channel region, strain relaxation does not occur at that location (or it will at least occur at a significantly lower amount), and thus, the stress/strain along the line and at least in neighboring devices will be retained at a much higher level. Maintaining that stress/strain improves the performance of the corresponding active transistor devices (e.g., at least the neighboring devices), as the maintained stress/strain in the channel region of those devices improves carrier mobility, thereby improving device performance. For instance, in some embodiments, the final strain in the active channel region of GAA devices that are adjacent to the dummy channel regions employing electrical isolation as variously described herein can include strain (e.g., compressive or tensile) in the amount of at least 250, 500, 750, 1000, 1250, or 1500 megapascals (MPa), for example. Such threshold amounts of strain are significant for increasing carrier mobility in the channel region of the active devices, such that retaining the strain leads to improved device performance.

In some embodiments, electrical isolation is achieved by converting the semiconductor nanowires/nanoribbons in a dummy channel region to an electrical insulator. In some such embodiments, the conversion from semiconductor material to insulator material can be achieved by oxidizing and/or nitridizing the nanowires/nanoribbons during, for example, replacement gate processing for the dummy channel region. The oxidizing and/or nitridizing may be achieved via thermal and/or catalytic processes, such as thermal oxidation and/or catalytic oxidation, for example. In some such embodiments, the conversion of the nanowires/nanoribbons in a dummy channel region to an electrical insulator can be detected based on the presence of oxygen and/or nitrogen in those nanowires/nanoribbons that would not otherwise be present (e.g., that is not present in the nanowires/nanoribbons of a neighboring active device). For instance, if the nanowires/nanoribbons were originally silicon germanium ($Si_xGe_{1-x}$) and oxidation processing occurred to convert them to an electrical insulator, the result would be that the nanowires/nanoribbons would include oxygen, such as in the form of $Si_xGe_{1-x}O_y$, for example. Detection of the conversion may also be based on the presence of catalysts in that dummy channel region that were used for a catalytic process, such as a catalytic oxidation process. For example, if aluminum oxide or alumina ($Al_2O_3$) were used as a catalyst to oxidize the nanowires/nanoribbons of the dummy channel region, then aluminum may remain in that dummy channel region that would not otherwise be there.

In some embodiments, electrical isolation is achieved by implanting dopant into the semiconductor nanowires/nanoribbons in a dummy channel region to create p-n junctions with adjacent source/drain regions. In other words, if an adjacent source/drain region includes p-type dopant (e.g., for PMOS devices), then n-type dopant can be added to the semiconductor nanowires/nanoribbons of the dummy channel region to create the p-n junction, and vice versa, where p-type dopant is added to the semiconductor nanowires/nanoribbons of the dummy channel region if the adjacent source/drain region is n-type doped. In some embodiments, opposite-type dopant relative to at least one adjacent source/drain region is added to the semiconductor nanowires/nanoribbons via implantation and/or diffusion processing. In some embodiments, the dopant added to the dummy channel region is at a concentration in the range of 2E18-1E21 atoms per cubic cm, for example. In some embodiments, the dopant added to the dummy channel region is at a concentration of at least 2E18, 5E18, 1E19, 5E19, 1E20, 5E20, or 1E21 atoms per cubic cm, for example.

As can be understood based on this disclosure, when exposing a dummy channel region by removing the dummy gate in that region to form a trench and access the multilayer stack of channel material layers and sacrificial layers, the sacrificial layers are removed and then the channel material layers are changed for electrical isolation purposes, in accordance with some embodiments. After the nanowires/nanoribbons in the dummy channel region have been changed for electrical isolation purposes, a structure is then formed in that dummy channel region trench, as opposed to forming a final gate structure (which would be the case for active channel regions). In some embodiments, that structure formed in the dummy channel region trench (that wraps around the nanowires/nanoribbons that were changed for electrical isolation purposes) is a dielectric structure, while in other embodiments, that structure is a floating metal gate structure that is electrically isolated such that it is not electrically interconnected to any other structures.

As can also be understood based on this disclosure, unlike, for example, planar transistor devices, GAA transistor devices can be electrically isolated using the isolation schemes described herein, such as using oxidation/nitridation and/or implantation schemes. In transistor device architecture employing nanowires/nanoribbons, the source/drain can be isolated either through the use of a silicon-on-insulator (SOI) substrate (or more generally, a semiconductor-on-insulator substrate) and/or a scheme where the source/drain are not physically in contact with the substrate (e.g., isolation regions are formed under the active source/drain regions). Because the source/drain is so isolated, it allows implanting or in-diffusing opposite type dopant relative to adjacent source/drain material in between active devices to electrically isolate them, as variously described herein. In addition, the electrical isolation can also be achieved by utilizing the large surface area to volume ratio in thermal oxidation/nitridation and catalytic oxidation/nitridation processes. Recall that the electrical isolation schemes described herein occur in the replacement metal gate portion of the CMOS process flow, where the poly/dummy gates can be removed selectively in targeted dummy regions where the isolation needs to be formed. The catalytic or thermal oxidation/nitridation, and/or implantation isolation can then be performed, which provides an electrical isolation between devices that need to be electrically decoupled. A benefit of the isolation schemes variously described herein is that it allows for any existing strain or stress in the wires of the dummy channel region and down the line to active devices to be fully (or better) retained. Numerous other benefits will be apparent in light of this disclosure.

Note that, as used herein, the expression "X includes at least one of A or B" refers to an X that includes, for example, just A only, just B only, or both A and B. To this end, an X that includes at least one of A or B is not to be understood as an X that requires each of A and B, unless expressly so stated. For instance, the expression "X includes A and B" refers to an X that expressly includes both A and B. Moreover, this is true for any number of items greater than two, where "at least one of" those items is included in X. For example, as used herein, the expression "X includes at least one of A, B, or C" refers to an X that includes just A only, just B only, just C only, only A and B (and not C), only A and C (and not B), only B and C (and not A), or each of A, B, and C. This is true even if any of A, B, or C happens to include multiple types or variations. To this end, an X that includes at least one of A, B, or C is not to be understood as an X that requires each of A, B, and C, unless expressly so stated. For instance, the expression "X includes A, B, and C" refers to an X that expressly includes each of A, B, and C. Likewise, the expression "X included in at least one of A or B" refers to an X that is included, for example, in just A only, in just B only, or in both A and B. The above discussion with respect to "X includes at least one of A or B" equally applies here, as will be appreciated. Moreover, this is true for any number of items.

Note that the use of "source/drain" or "S/D" herein is simply intended to refer to a source region or a drain region or both a source region and a drain region. To this end, the forward slash ("/") as used herein means "and/or" unless otherwise specified, and is not intended to implicate any particular structural limitation or arrangement with respect to source and drain regions, or any other materials or features that are listed herein in conjunction with a forward slash.

Further note that the terms "active" or "functional" as used herein with respect to a given transistor device or channel region are not to be interpreted to mean that the device or channel have to be conducting or otherwise in a currently operational mode. Rather, such terms are simply used to indicate that a given transistor device or channel region is intended to be used or otherwise active when the integrated circuit in which includes the device or channel region is powered-on and functioning properly. Other devices or channels regions of that integrated circuit may be in inactive or so-called dummification areas. Such inactive devices and channel regions are generally not part of the functional circuitry.

Use of the techniques and structures provided herein can be detected using tools such as: electron microscopy including scanning/transmission electron microscopy (SEM/TEM), scanning transmission electron microscopy (STEM), nano-beam electron diffraction (NBD or NBED), and reflection electron microscopy (REM); composition mapping; x-ray crystallography or diffraction (XRD); energy-dispersive x-ray spectroscopy (EDX); secondary ion mass spectrometry (SIMS); time-of-flight SIMS (ToF-SIMS); atom probe imaging or tomography; local electrode atom probe (LEAP) techniques; 3D tomography; or high resolution physical or chemical analysis, to name a few suitable example analytical tools. In particular, in some embodiments, such tools can indicate an integrated circuit including at least one gate-all-around (GAA) transistor and including an isolation scheme as variously described herein. For instance, the at least one GAA transistor, which includes an active channel region and source/drain regions, may be adjacent to a dummy channel region where the one or more nanowires/nanoribbons in that dummy region were changed to insulator material and/or doped with opposite type dopant relative to an adjacent source/drain region. In some embodiments, the dummy channel region between two GAA transistors. In some embodiments, the techniques described herein can be detected based on the structures formed therefrom. In addition, in some embodiments, the techniques and structures described herein can be detected based on the benefits derived therefrom. Numerous configurations and variations will be apparent in light of this disclosure.

Architecture and Methodology

Figure 2:
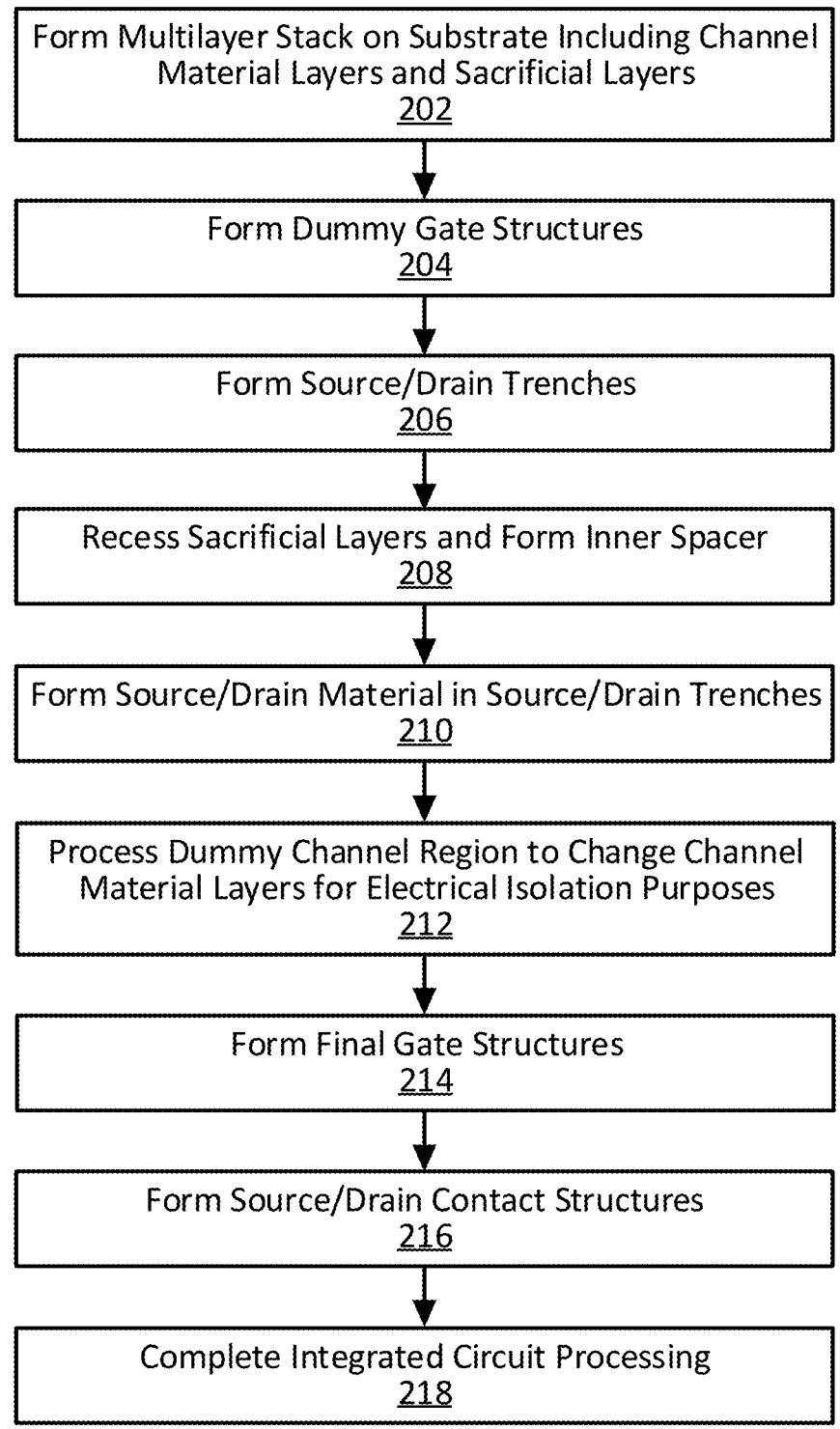
FIG. 2 illustrates example method 200 of forming an integrated circuit including various isolation schemes for gate-all-around (GAA) transistor devices, in accordance with some embodiments.

FIG. 2 illustrates example method 200 of forming an integrated circuit (IC) including various isolation schemes for gate-all-around (GAA) transistor devices, in accordance with some embodiments. A multitude of different transistor devices can benefit from the techniques described herein, which includes, but is not limited to, various field-effect transistors (FETs), such as metal-oxide-semiconductor FETs (MOSFETs), tunnel FETs (TFETs), and Fermi filter FETs (FFFETs) (also known as tunnel source MOSFETs), to name a few examples. For example, the techniques can be used to benefit an n-channel MOSFET (NMOS) device, which may include a source-channel-drain scheme of n-p-n or n-i-n, where 'n' indicates n-type doped semiconductor material, 'p' indicates p-type doped semiconductor material, and 'i' indicates intrinsic/undoped semiconductor material (which may also include nominally undoped semiconductor material, including dopant concentrations of less than 1E16 atoms per cubic centimeter (cm), for example), in accordance with some embodiments. In another example, the techniques can be used to benefit a p-channel MOSFET (PMOS) device, which may include a source-channel-drain scheme of p-n-p or p-i-p, in accordance with some embodiments. In yet another example, the techniques can be used to benefit a TFET device, which may include a source-channel-drain scheme of p-i-n or n-i-p, in accordance with some embodiments. In other words, a TFET device may appear the same as a MOSFET device, except that the source and drain regions include opposite type dopant. In still another example, the techniques can be used to benefit a FFFET device, which may include a source-channel-drain scheme of np-i-p (or np-n-p) or pn-i-n (or pn-p-n), in accordance with some embodiments. In other words, such FFFET devices include a bilayer source region configuration where one of the sub-layers of the bilayer includes n-type dopant and the other includes p-type dopant.

Although the techniques are depicted and described herein for gate-all-around (GAA) device configurations (e.g., employing one or more nanowires or nanoribbons), the techniques could be used for other device configurations, such as FinFET configurations, for example. Further, the techniques are used in some embodiments to benefit complementary transistor circuits, such as complementary MOS (CMOS) circuits, where the techniques may be used to benefit one or more of the included n-channel and/or p-channel transistors making up the CMOS circuit. Other example transistor devices that can benefit from the techniques described herein include few to single electron quantum transistor devices, in accordance with some embodiments. Further still, any such devices may employ semiconductor materials that are three-dimensional crystals as well as two dimensional crystals or nanotubes, for example. In some embodiments, the techniques may be used to benefit devices of varying scales, such as IC devices having critical dimensions in the micrometer (micron) range and/or in the nanometer (nm) range (e.g., formed at the 22, 14, 10, 7, 5, or 3 nm process nodes, or beyond).

Note that deposition or epitaxial growth techniques (or more generally, additive processing) where described herein can use any suitable techniques, such as chemical vapor deposition (CVD), physical vapor deposition (PVD), atomic layer deposition (ALD), and/or molecular beam epitaxy (MBE), to provide some examples. Also note that etching techniques (or more generally, subtractive processing) where described herein can use any suitable techniques, such as wet and/or dry etch processing which may be isotropic (e.g., uniform etch rate in all directions) or anisotropic (e.g., etch rates that are orientation dependent), and which may be non-selective (e.g., etches all exposed materials at the same or similar rates) or selective (e.g., etches different materials that are exposed at different rates). Further note that other processing may be used to form the and integrated circuit structures described herein, as will be apparent in light of this disclosure, such as hardmasking, patterning or lithography (via suitable lithography techniques, such as, e.g., photolithography, extreme ultraviolet lithography, x-ray lithography, or electron beam lithography), planarizing or polishing (e.g., via chemical-mechanical planarization (CMP) processing), doping (e.g., via ion implantation, diffusion, or including dopant in the base material during formation), and annealing, to name some examples.

In embodiments where semiconductor material described herein includes dopant, the dopant is any suitable n-type and/or p-type dopant that is known to be used for the specific semiconductor material. For instance, in the case of group IV semiconductor materials (e.g., Si, SiGe, Ge), p-type dopant includes group III atoms (e.g., boron, gallium, aluminum), and n-type dopant includes group V atoms (e.g., phosphorous, arsenic, antimony). In the case of group III-V semiconductor materials (e.g., GaAs, InGaAs, InP, GaP), p-type dopant includes group II atoms (e.g., beryllium, zinc, cadmium), and n-type dopant includes group VI atoms (e.g., selenium, tellurium). However, for group III-V semiconductor materials, group VI atoms (e.g., silicon, germanium) can be employed for either p-type or n-type dopant, depending on the conditions (e.g., formation temperatures). In embodiments where dopant is included in semiconductor material, the dopant can be included at quantities in the range of 1E16 to 1E22 atoms per cubic cm, or higher, for example, unless otherwise stated. In some embodiments, dopant is included in semiconductor material in a quantity of at least 1E16, 1E17, 1E18, 5E18, 1E19, 5E19, 1E20, 5E20, or 1E21 atoms per cubic cm and/or of at most 1E22, 5E21, 1E21, 5E20, 1E20, 5E19, 1E19, 5E18, or 1E18 atoms per cubic cm, for example. In some embodiments, semiconductor material described herein is undoped/intrinsic, or includes relatively minimal dopant, such as a dopant concentration of less than 1E16 atoms per cubic cm, for example.

Note that the use of "group IV semiconductor material" (or "group IV material" or generally, "IV") herein includes at least one group IV element (e.g., silicon, germanium, carbon, tin), such as silicon (Si), germanium (Ge), silicon germanium (SiGe), and so forth. The use of "group III-V semiconductor material" (or "group III-V material" or generally, "III-V") herein includes at least one group III element (e.g., aluminum, gallium, indium) and at least one group V element (e.g., nitrogen, phosphorus, arsenic, antimony, bismuth), such as gallium arsenide (GaAs), indium gallium arsenide (InGaAs), indium aluminum arsenide (InAlAs), gallium phosphide (GaP), gallium antimonide (GaSb), indium phosphide (InP), and so forth. Also note that group III may also be known as the boron group or IUPAC group 13, group IV may also be known as the carbon group or IUPAC group 14, and group V may also be known as the nitrogen group or IUPAC group 15, for example. Further note that semiconductor material described herein has a monocrystalline or single-crystal structure (also referred to as a crystalline structure) unless otherwise explicitly stated (e.g., unless referred to as having a polycrystalline or amorphous structure).

Method 200 of FIG. 2 includes forming 202 a multilayer stack on a substrate, the multilayer stack including one or more channel material layers and one or more sacrificial layers, in accordance with some embodiments. For instance, FIG. 3A illustrates an example cross-sectional view of an integrated circuit structure including a multilayer stack 310 on a substrate 300, in accordance with some embodiments. Note that the cross-sectional view of FIG. 3A is taken along what will be the channel region and perpendicular to what will become the gate lines. Such a view may also be considered a gate cut view. As can be understood based on this disclosure, the multilayer stack 310, which includes sacrificial layers 311 and channel material layers 312 in the structure of FIG. 3A, is to be used to form one or more GAA transistor devices, where the one or more channel material layers 312 are to be released from the one or more sacrificial layers 311 via selective etch processing to enable forming the gate structure of each device around the released channel material layers 312. Each of those channel material layers 312 may be referred to herein as a body, and each channel material layer or body 312 may be considered a nanowire or nanoribbon, as can also be understood based on this disclosure.

Figure 3B:
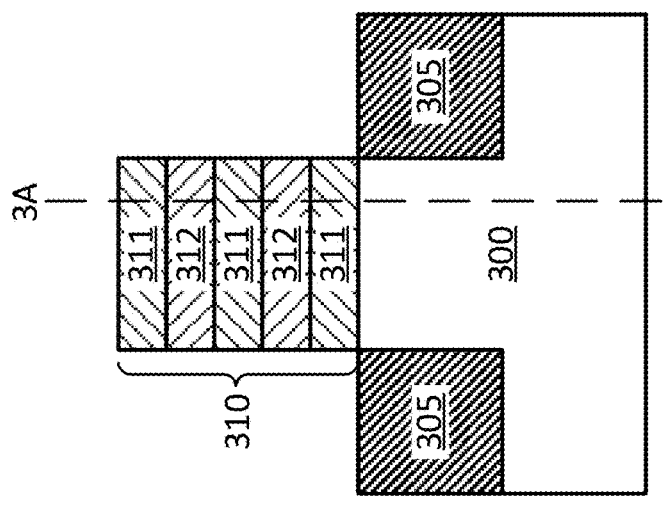
FIG. 3B illustrates an example cross-sectional view along dashed line 3B shown in FIG. 3A, in accordance with some embodiments. Note that the cross-sectional view of FIG. 3A corresponds to the view taken along dashed line 3A in FIG. 3B.
Figure 3A:
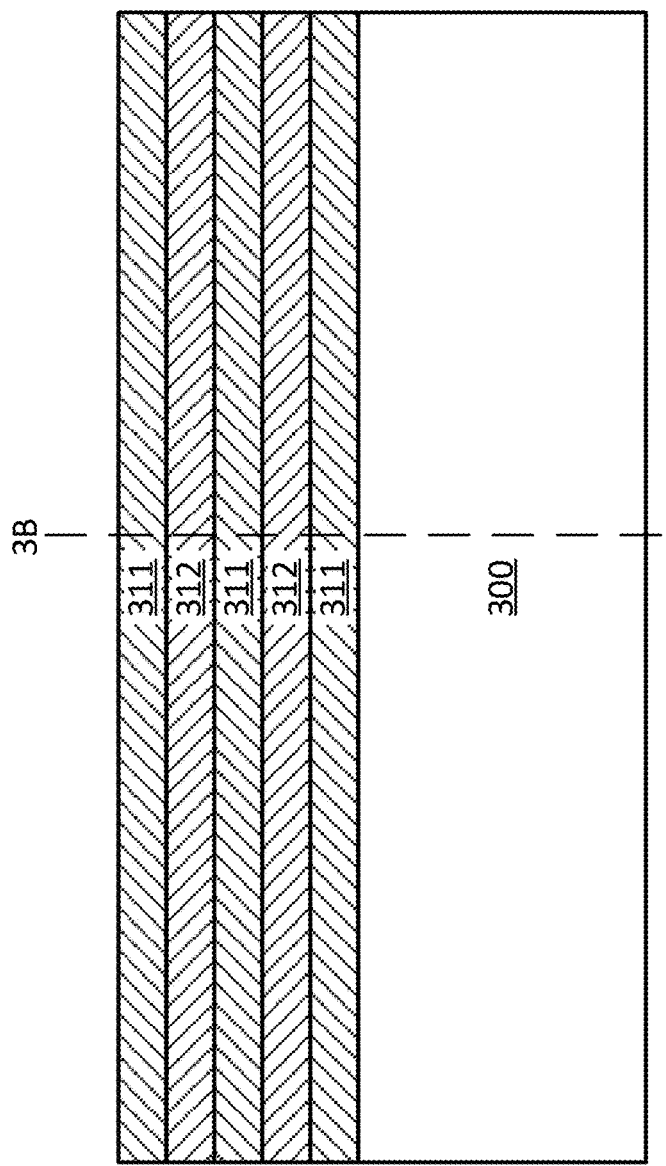
FIG. 3A illustrates an example cross-sectional view of an integrated circuit structure including a multilayer stack on a substrate, in accordance with some embodiments. Note that the cross-sectional view of FIG. 3A is taken along what will be the channel region and perpendicular to what will become the gate lines. Such a view may also be considered a gate cut view.

As shown in FIG. 3B, the multilayer stack 310 including layers 311 and 312 has a fin shape. In more detail, FIG. 3B illustrates an example cross-sectional view along dashed line 3B shown in FIG. 3A, in accordance with some embodiments. Note that the cross-sectional view of FIG. 3A corresponds to the view taken along dashed line 3A in FIG. 3B. In some embodiments, layers 311 and 312 in the fin-shaped multilayer stack 310 can be formed using any suitable techniques as can be understood based on this disclosure. For instance, in some embodiments, the layers 311 and 312 are blanket deposited on substrate 300, patterned into fins, and then shallow trench isolation (STI) processing can be performed to form the isolation or STI regions 305, such as is shown in FIG. 3B. In other embodiments, a replacement fin processing scheme is employed, where the top portion of substrate 300 is formed into fins, STI material is formed in the trenches between the fins, the fins are recessed to form trenches between STI regions, layers 311 and 312 are deposited in the STI region trenches, and then the STI material is recessed to expose the fin-shaped multilayer stack, such as is shown in FIG. 3B. Thus, various different processes can be used to form the structure of FIGS. 3A and 3B. Although there is only one fin-shaped multilayer stack 310 shown in FIG. 3B, multiple different multilayer stacks and lines may be processed simultaneously to form hundreds, thousands, millions, or even billions of devices on an individual integrated circuit substrate, as can be understood based on this disclosure.

Substrate 300, in some embodiments, is: a bulk substrate including group IV semiconductor material (such as Si, Ge, or SiGe), group III-V semiconductor material, and/or any other suitable material as can be understood based on this disclosure; an X on insulator (XOI) structure where X is one of the aforementioned semiconductor materials and the insulator material is an oxide material or dielectric material, such that the XOI structure includes the electrically insulating material layer between two semiconductor layers (e.g., a silicon-on-insulator (SOI) structure); or some other suitable multilayer structure where the top layer includes semiconductor material from which the materials of multilayer stack 310 can be formed. In some embodiments, the substrate is an insulator or dielectric substrate, such as a glass substrate. In some such embodiments, the layers for multilayer stack 310 can be transferred to that insulator or dielectric substrate to achieve a desired quality (e.g., monocrystalline quality). In some embodiments, substrate 300 is a bulk silicon substrate (that either does or does not include dopant), which may be utilized based on the relatively low cost and availability of such bulk silicon substrates. In some embodiments, substrate 300 is a SOI substrate, which can help with electrical isolation of the source/drain regions, as described herein.

In some embodiments, substrate 300 includes a surface crystalline orientation described by a Miller index of (100), (110), or (111), or its equivalents. Although substrate 300 is shown in the figures as having a thickness (dimension in the Y-axis direction) similar to other layers for ease of illustration, in some instances, substrate 300 may be relatively much thicker than the other layers, such as having a thickness in the range of 1 to 950 microns (or in the sub-range of 20 to 800 microns), for example, or any other suitable thickness value or range as can be understood based on this disclosure. In some embodiments, substrate 300 includes a multilayer structure including two or more distinct layers (that may or may not be compositionally different). In some embodiments, substrate 300 includes grading (e.g., increasing and/or decreasing) of one or more material concentrations throughout at least a portion of the substrate 300. In some embodiments, substrate 300 is used for one or more other IC devices, such as various diodes (e.g., light-emitting diodes (LEDs) or laser diodes), various transistors (e.g., MOSFETs, TFETs), various capacitors (e.g., MOSCAPs), various microelectromechanical systems (MEMS), various nanoelectromechanical systems (NEMS), various radio frequency (RF) devices, various sensors, and/or any other suitable semiconductor or IC devices, depending on the end use or target application. Accordingly, in some embodiments, the structures described herein are included in system-on-chip (SoC) applications.

Multilayer stack 310, in some embodiments, includes one or more sacrificial layers 311 and one or more channel material layers 312. As shown in FIGS. 3A and 3B, the layers 311 and 312 in multilayer stack 310 alternate, where the first and last layer in the multilayer stack 310 is a sacrificial layer 311. Specifically, the multilayer stack 310 in FIGS. 3A and 3B includes three sacrificial layers 311 and two channel material layers 312, as shown. However, in other embodiments, any number of sacrificial layers 311 and channel material layers 312 may be employed, such as 1-10 or more of each. In addition, in some embodiments, the same number of sacrificial layers 311 and channel material layers 312 are included in the multilayer stack 310.

Sacrificial layers 311 and channel material layers 312, in some embodiments, include semiconductor material. In some embodiments, the layers 311 and 312 include group IV and/or group III-V semiconductor material. Thus, in some embodiments, layers 311 and 312 include one or more of germanium, silicon, tin, indium, gallium, aluminum, arsenic, phosphorous, antimony, bismuth, or nitrogen. In some embodiments, the semiconductor material included in one or both of layers 311 and/or 312 also includes dopant (n-type and/or p-type dopant), while in other embodiments, the semiconductor material is undoped/intrinsic. In some embodiments, the semiconductor material included in sacrificial layer 311 can be selectively removed relative to the semiconductor material included in channel material layers 312 via selective etch processing. Such selective etch processing allows the sacrificial layers 311 to be removed during the replacement gate processing to release the channel material layers 312.

Thus, in some embodiments, sacrificial layer 311 and channel material layers include compositionally different material, which provides the etch selectivity described herein between the two materials. Materials that are "compositionally different" or "compositionally distinct" as used herein refers to two materials that have different chemical compositions. This compositional difference may be, for instance, by virtue of an element that is in one material but not the other (e.g., silicon germanium is compositionally different from silicon), or by way of one material having all the same elements as a second material but at least one of those elements is intentionally provided at a different concentration in one material relative to the other material (e.g., SiGe having 70 atomic percent germanium is compositionally different from SiGe having 25 atomic percent germanium). In addition to such chemical composition diversity, the materials may also have distinct dopants (e.g., boron versus arsenic/phosphorous) or the same dopants but at differing concentrations. In still other embodiments, compositionally different materials may further refer to two materials that have different crystallographic orientations. For instance, (110) Si is compositionally distinct or different from (100) Si.

In some embodiments, both of layers 311 and layers 312 include group IV semiconductor material. For instance, in some such embodiments, one of layers 311 or layers 312 includes Si, and the other of layers 311 or layers 312 includes SiGe or Ge (e.g., sacrificial layers 311 include Si and channel material layers include Ge). Further, in some embodiments, one of layers 311 or layers 312 includes SiGe, and the other of layers 311 or layers 312 includes Si, Ge, or SiGe. Further still, in some embodiments, one of layers 311 or layers 312 includes Ge, and the other of layers 311 or layers 312 includes Si or SiGe. Regardless, in any such embodiments where both of layers 311 and 312 include group IV semiconductor material, the Ge concentration included in layers 311 and 312 may be relatively different by at least 5, 10, 15, 20, 25, 30, 35, or 40 atomic percent to ensure etch selectivity can be achieved, for example. In some embodiments, both of layers 311 and 312 include group III-V semiconductor material. For instance, in some such embodiments, one of layers 311 or layers 312 includes GaAs, and the other of layers 311 or layers 312 includes InGaAs or InP. Further in some embodiments, one of layers 311 or layers 312 includes InGaAs, and the other of layers 311 or layers 312 includes GaAs, InP, or InGaAs (e.g., with a different In:Ga ratio). Further still, in some embodiments, one of layers 311 or layers 312 includes InP, and the other of layers 311 or 312 includes GaAs or InGaAs. In some embodiments, one of layers 311 or layers 312 includes group IV semiconductor material, and the other of layers 311 or layers 312 includes group III-V semiconductor material. For instance, in some such embodiments, one of layers 311 or layers 312 includes SiGe or Ge, and the other of layers 311 or layers 312 includes GaAs, InGaAs, or InP, for example.

In some embodiments, multilayer stack 310 has a thickness (dimension in the Y-axis direction) in the range of 5-200 nm (or in a subrange of 5-25, 5-50, 5-100, 10-25, 10-50, 10-80, 10-100, 10-200, 20-80, 20-100, 20-200, 40-80, 40-120, 40-200, 50-100, 50-200, or 100-200 nm) or greater, or within any other suitable range or having any other suitable value as can be understood based on this disclosure. In some embodiments, multilayer stack 310 has a thickness of at least 5, 10, 15, 20, 25, 50, 80, 100, 120, or 150 nm, and/or at most 200, 150, 120, 100, 80, 50, or 25 nm, for example. In some embodiments, sacrificial layers 311 and channel material layers 312 have a thickness (dimension in the Y-axis dimension) in the range of 2-100 nm (or in a subrange of 2-10, 2-25, 2-40, 2-50, 2-75, 4-10, 4-25, 4-40, 4-50, 4-75, 4-100, 10-25, 10-40, 10-50, 10-75, 10-100, 25-40, 25-50, 25-75, 25-100, or 50-100 nm) or greater, or any other suitable value or range as can be understood based on this disclosure. In some embodiments, sacrificial layers 311 and channel material layers 312 have a thickness of at least 2, 5, 8, 10, 15, 20, 25, or 50 nm, and/or a height of at most 100, 75, 50, 40, 30, 25, 20, 15, 12, or 10 nm, for example. In some embodiments, sacrificial layers 311 and channel material layers 312 all have the same thicknesses, such as is shown in FIGS. 3A and 3B. However, in other embodiments, the thicknesses may differ. For instance, in some embodiments, the thicknesses of sacrificial layers 311 may all be the same, and the thicknesses of channel material layer 312 may all be the same, but the thicknesses of layers 311 relative to layers 312 may be different (where layers 311 would be relatively thicker or thinner than layers 312). In some embodiments, the thickness of a sacrificial layer 311 is different relative to another sacrificial layer 311 and/or the thickness of a channel material layer 312 is different relative to another channel material layer 312. Moreover, the thicknesses of the channel material layers 312 may be affected by the selective etch processing used to at least partially remove sacrificial layers 311 and release layers 312 from layers 311, as can be understood based on this disclosure.

Isolation or STI regions 305, in some embodiments, include one or more dielectrics, such as one or more oxides (e.g., silicon dioxide), nitrides (e.g., silicon nitride), high-k dielectrics, low-k dielectrics, and/or any other suitable electrically insulating material as will be apparent in light of this disclosure. In some embodiments, isolation regions 305 include silicon, oxygen, nitrogen, and/or carbon. For instance, in some embodiments, isolation regions 305 include silicon dioxide, silicon nitride, silicon oxynitride, and/or carbon-doped silicon dioxide (or other carbon-doped oxides).

Figure 4B:
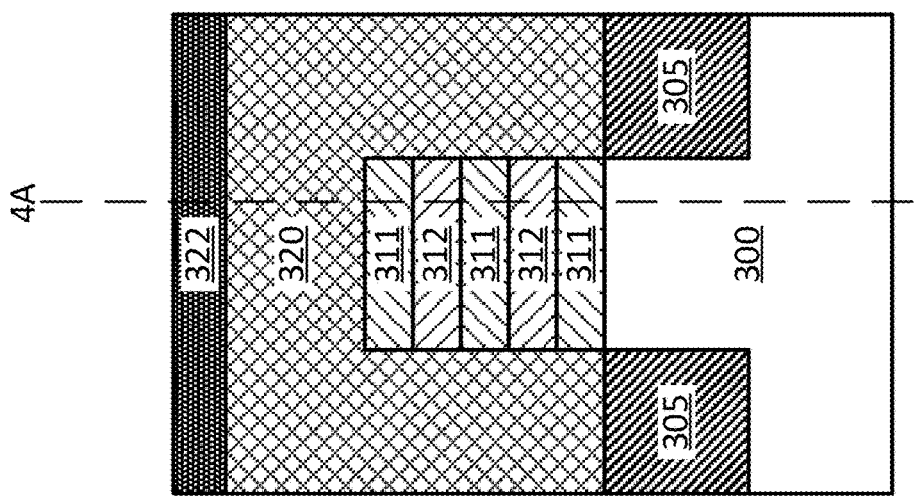
FIG. 4B illustrates an example cross-sectional view along dashed line 4B shown in FIG. 4A, in accordance with some embodiments. Note that the cross-sectional view of FIG. 4A corresponds to the view taken along dashed line 4A in FIG. 4B.
Figure 4A:
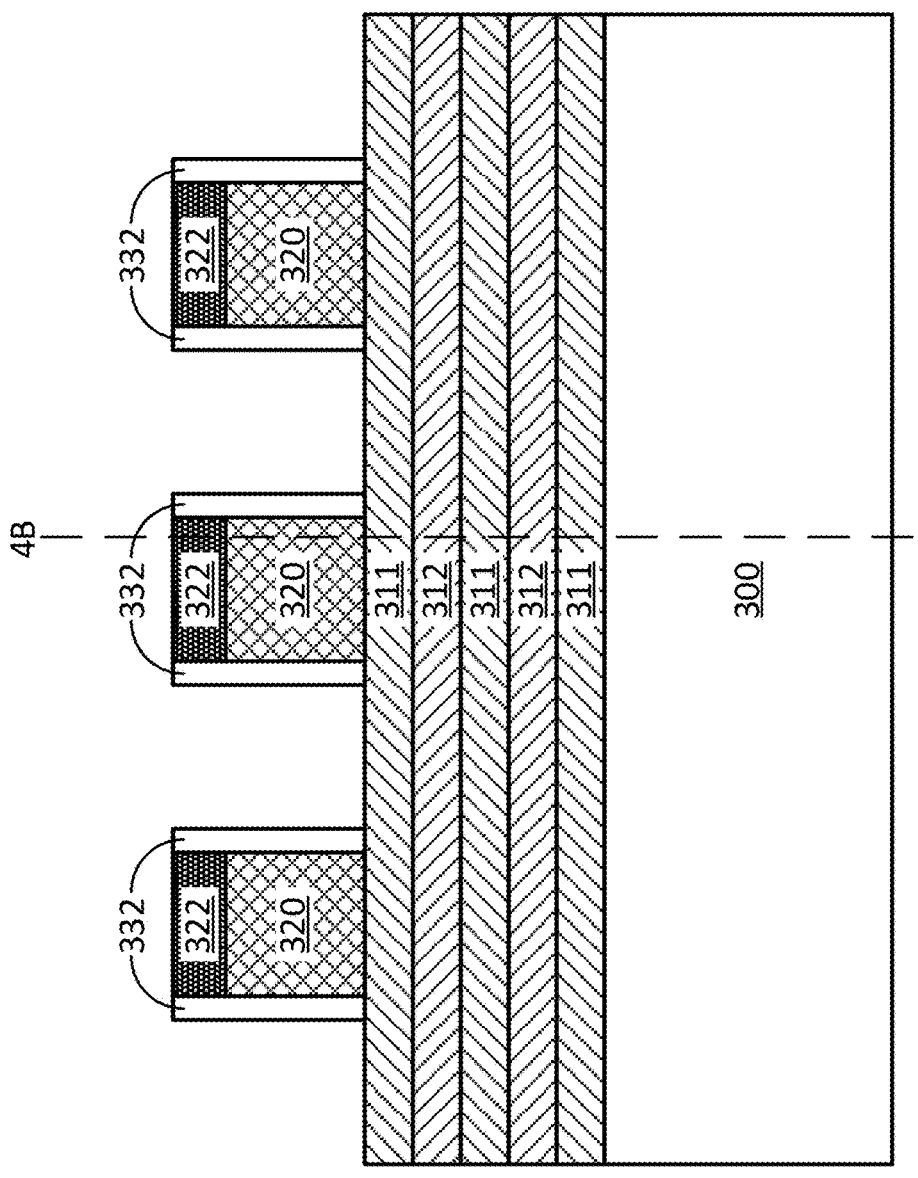
FIG. 4A illustrates the view of FIG. 3A after dummy gate structures have been formed, in accordance with some embodiments.

Method 200 of FIG. 2 continues with forming 204 dummy gate structures, in accordance with some embodiments. For instance, FIG. 4A illustrates the view of FIG. 3A after dummy gate structures 320 have been formed, in accordance with some embodiments. FIG. 4B illustrates an example cross-sectional view along dashed line 4B shown in FIG. 4A, in accordance with some embodiments. Note that the cross-sectional view of FIG. 4A corresponds to the view taken along dashed line 4A in FIG. 4B. In some embodiments, the dummy gate structures 320 of FIGS. 4A and 4B include a dummy gate dielectric (e.g., dummy oxide material) and a dummy gate electrode (e.g., dummy poly-silicon material) to be used for replacement gate processing in a gate-last process flow, as can be understood based on this disclosure. However, in other embodiments, dummy gate structures 320 includes any suitable sacrificial material that can be layer removed such to access multilayer stack 310 as described herein. Dummy gate structures 320, in some embodiments, can be formed 204 using any suitable techniques, such as depositing the material of dummy gate structures 320 and then patterning and etching it to form the structures shown in FIGS. 4A and 4B. Optional hard mask material 322 (e.g., including dielectric material) was also formed on dummy gate structures 320 to help protect those structures during subsequent processing, in this example embodiment. However, such hard masks 322 need not be utilized, in some embodiments.

FIGS. 4A and 4B also illustrate that gate side-wall spacers 332, referred to herein as gate spacers (or simply, spacers) were also formed on either side of the dummy gate structures 320. Such gate spacers 332 can be formed using any suitable techniques, such as depositing the material of gate spacers 332 and performing spacer pattern and etch processing, for example. In some embodiments, the gate spacers 332 are used to help determine the final gate length and/or channel length (dimensions in the X-axis direction), and to help with the replacement gate processing. In some embodiments, gate spacers 332 include any dielectric material, such as an oxide (e.g., silicon dioxide), nitride (e.g., silicon nitride), high-k dielectric, low-k dielectric, and/or any other suitable electrically insulating material as can be understood based on this disclosure. In some embodiments, gate spacers 332 include silicon, oxygen, nitrogen, and/or carbon. For instance, in some embodiments, gate spacers 332 include silicon dioxide, silicon monoxide, silicon nitride, silicon oxynitride, or carbon-doped silicon dioxide (or other carbon-doped oxides). In some embodiments, it is desired to select material for gate spacers 332 that has a low dielectric constant and a high breakdown voltage. In some embodiments, gate spacers 332 include a multilayer structure (e.g., a bilayer structure where the sub-layers are laterally adjacent to each other in the X-axis direction), even though it is illustrated as a single layer in the example structure of FIG. 4A.

Figure 5B:
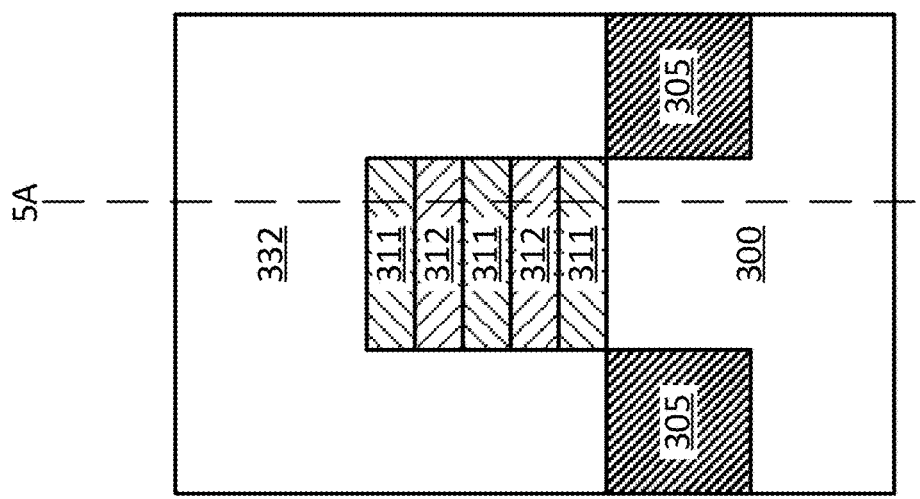
FIG. 5B illustrates an example cross-sectional view along dashed line 5B shown in FIG. 5A, in accordance with some embodiments. Note that the cross-sectional view of FIG. 5A corresponds to the view taken along dashed line 5A in FIG. 5B.
Figure 5A:
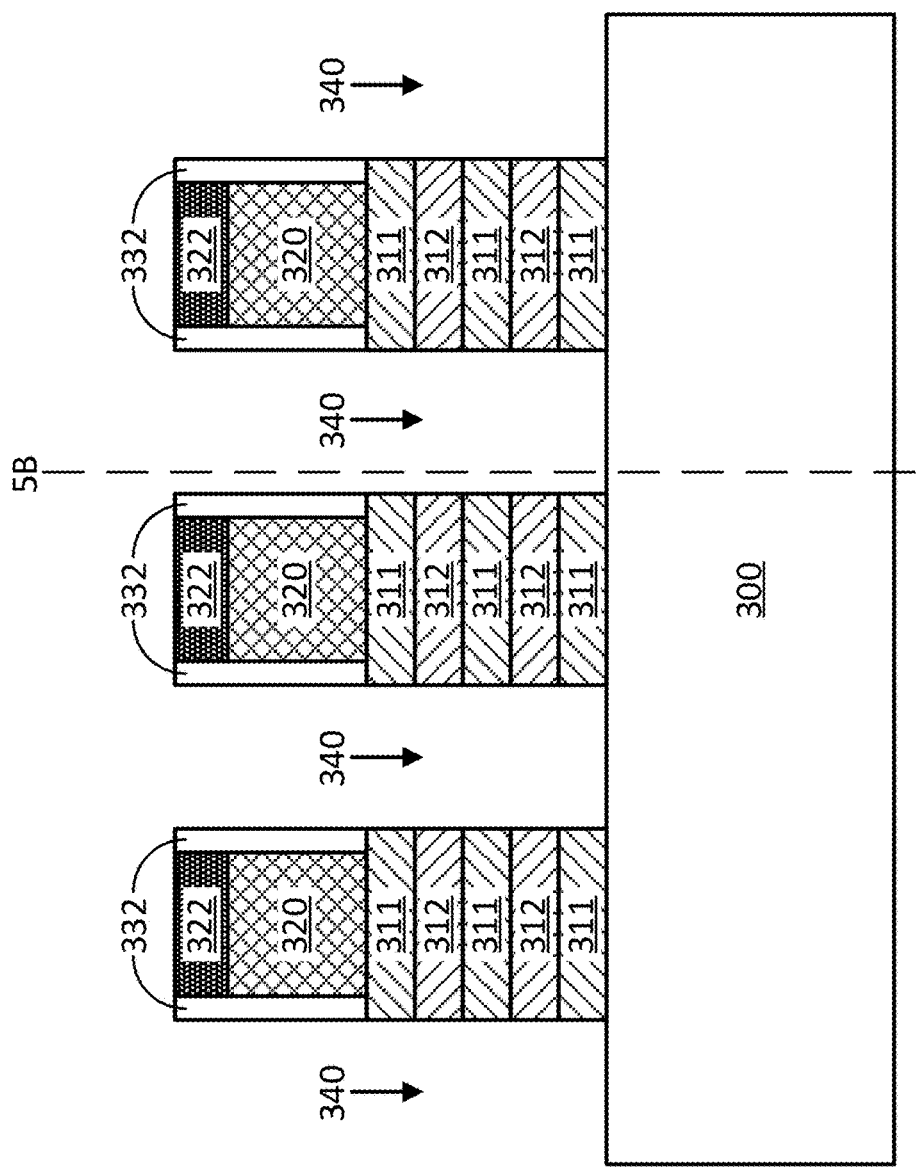
FIG. 5A illustrates the view of FIG. 4A after source/drain trenches have been formed, in accordance with some embodiments.

Method 200 of FIG. 2 continues with forming 204 source/drain trenches, in accordance with some embodiments. Note that the designation source/drain is used herein to refer to either a source or a drain, as the regions may be similar in the end structure but be differentiated based on how the device is electrically connected. For instance, this may be the case for MOSFET devices, such as NMOS and PMOS devices, where the source and drain regions may include the same material and doping scheme. However, in some embodiments, the source and drain regions may be configured differently, such as for TFET devices, where the source and drain regions are oppositely-type doped. In addition, the shape of the regions may differ, in some embodiments. Regardless, for ease of description, each of the source and drain are individually referred to herein as simply source/drain. For instance, FIG. 5A illustrates the view of FIG. 4A after source/drain trenches 340 have been formed, in accordance with some embodiments. FIG. 5B illustrates an example cross-sectional view along dashed line 5B shown in FIG. 5A, in accordance with some embodiments. Note that the cross-sectional view of FIG. 5A corresponds to the view taken along dashed line 5A in FIG. 5B. In some embodiments, source/drain trenches can be formed using any suitable techniques, such as etching (via wet and/or dry etch processing) multilayer stack 310 in the exposed locations to form trenches 340, for example.

Figure 6B:
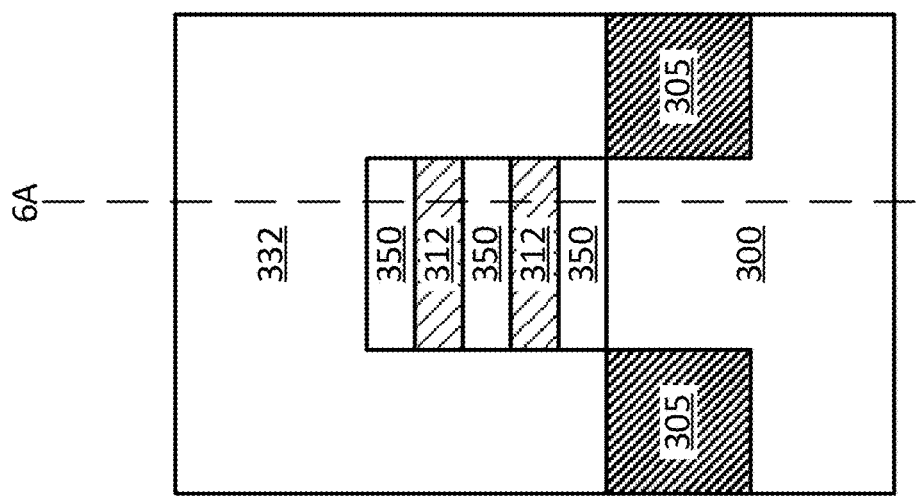
FIG. 6B illustrates an example cross-sectional view along dashed line 6B shown in FIG. 6A, in accordance with some embodiments. Note that the cross-sectional view of FIG. 6A corresponds to the view taken along dashed line 6A in FIG. 6B.
Figure 6A:
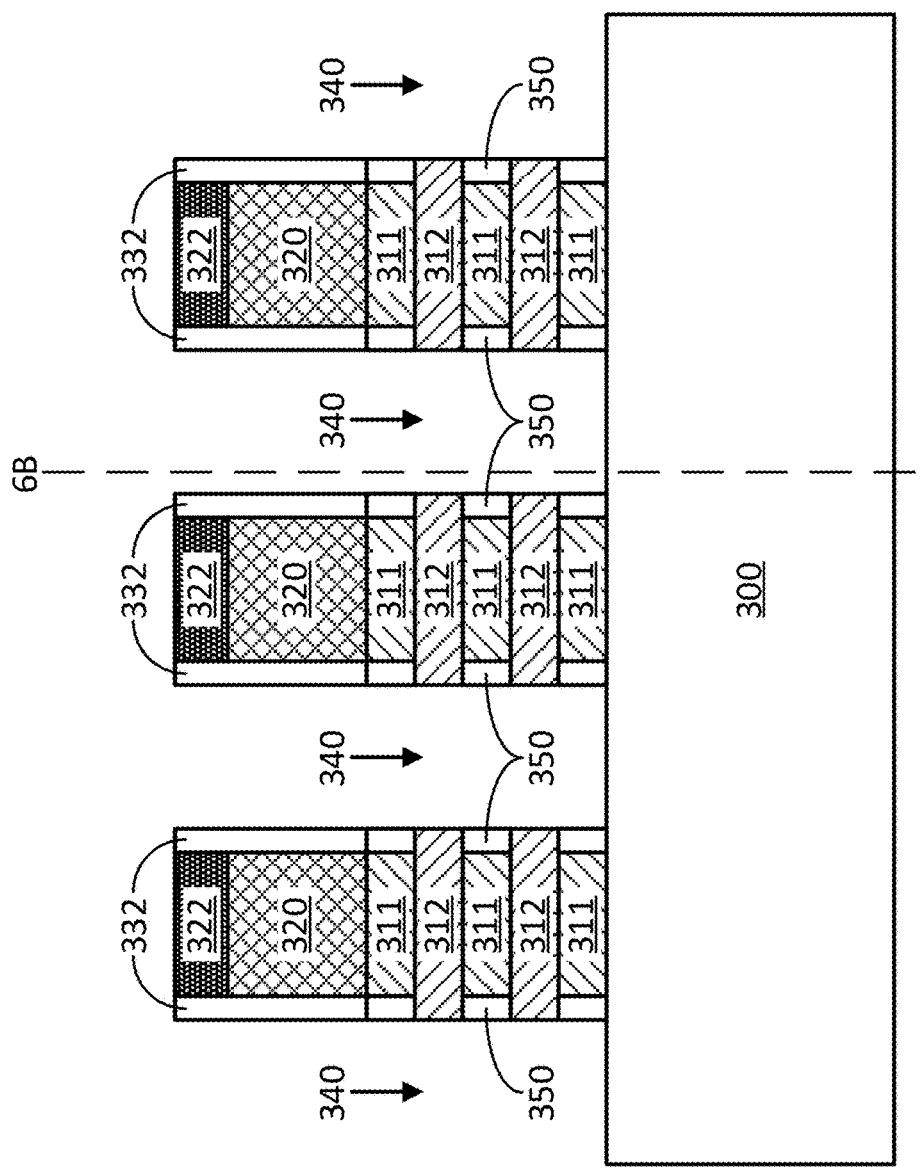
FIG. 6A illustrates the view of FIG. 5A after inner spacers have been formed, in accordance with some embodiments.

Method 200 of FIG. 2 continues with recessing 208 the sacrificial layers and forming inner spacers, in accordance with some embodiments. For instance, FIG. 6A illustrates the view of FIG. 5A after inner spacers 350 have been formed, in accordance with some embodiments. FIG. 6B illustrates an example cross-sectional view along dashed line 6B shown in FIG. 6A, in accordance with some embodiments. Note that the cross-sectional view of FIG. 6A corresponds to the view taken along dashed line 6A in FIG. 6B. In some embodiments, inner spacers 350 can be formed using any suitable techniques, such as selectively etching the material of sacrificial layers 311 (selective to the material of channel material layers 312) through source/drain trenches 340 to recess those layers 311 and then depositing the material of inner spacers 350, for example. In some such embodiments, the inner spacer material 350 is deposited by ALD in the recesses formed by selectively etching sacrificial layers 311. Further, the inner spacer material 350 may be formed elsewhere, such as on gate spacers 332 and the outside of channel material layers 312, but it may be etched by an isotropic etch to remove the inner spacer material 350 that is not located inside the sacrificial layer 311 recesses, for example. In some embodiments, inner spacers 350 include dielectric material, such as any suitable oxide (e.g., silicon dioxide), nitride (e.g., silicon nitride), high-k dielectric, low-k dielectric, and/or any other suitable electrically insulating material as can be understood based on this disclosure. In some embodiments, inner spacers 350 include silicon, oxygen, nitrogen, and/or carbon. For instance, in some embodiments, inner spacers 350 include silicon dioxide, silicon monoxide, silicon nitride, silicon oxynitride, or carbon-doped silicon dioxide (or other carbon-doped oxides). In some embodiments, gate spacers 332 and inner spacers 350 include the same material, while in other embodiments they include different material. For instance, in an example embodiment, one of the gate spacers 332 or inner spacers 350 includes silicon dioxide, and the other of the gate spacers 332 or inner spacers 350 includes silicon nitride.

Figure 7B:
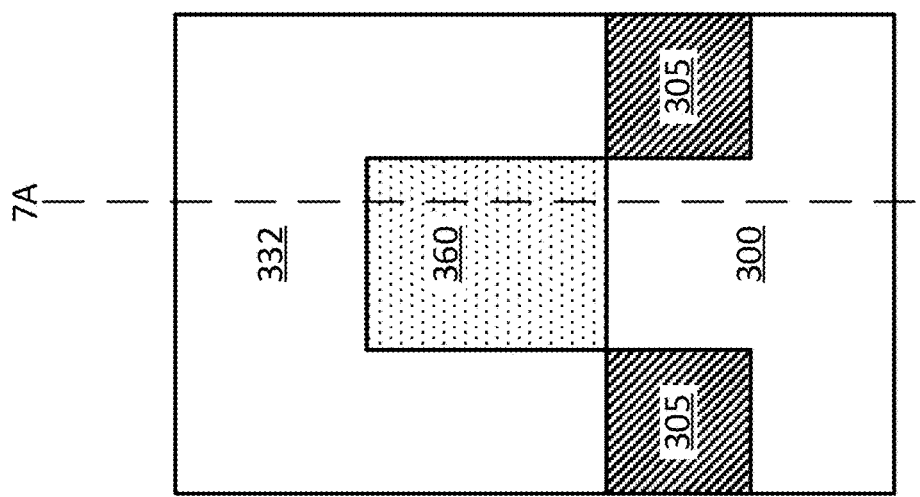
FIG. 7B illustrates an example cross-sectional view along dashed line 7B shown in FIG. 7A, in accordance with some embodiments.
Figure 7A:
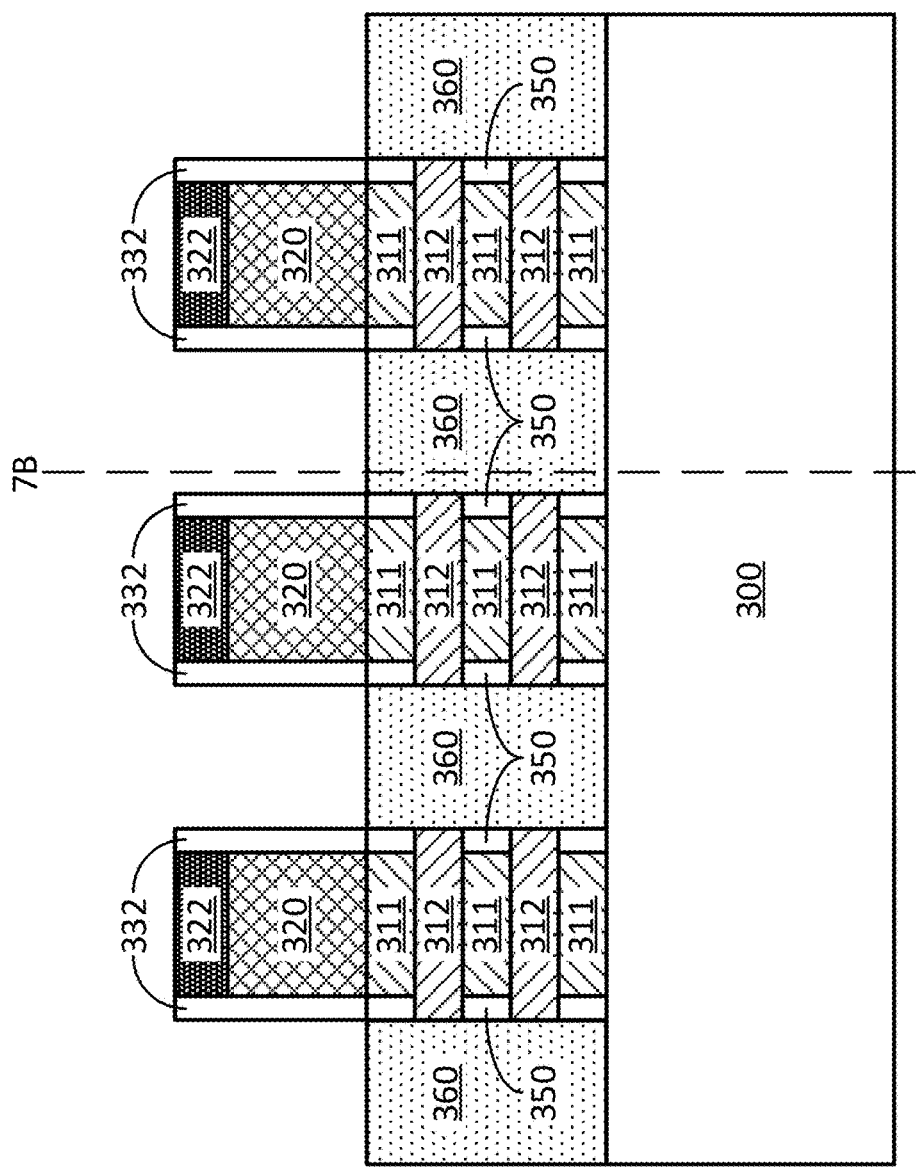
FIG. 7A illustrates the view of FIG. 6A after source/drain material has been formed in the source/drain trenches, in accordance with some embodiments.

Method 200 of FIG. 2 continues with forming 210 source/drain material in the source/drain trenches, in accordance with some embodiments. For instance, FIG. 7A illustrates the view of FIG. 6A after source/drain material 360 has been formed in the source/drain trenches 340, in accordance with some embodiments. FIG. 7B illustrates an example cross-sectional view along dashed line 7B shown in FIG. 7A, in accordance with some embodiments. Note that the cross-sectional view of FIG. 7A corresponds to the view taken along dashed line 7A in FIG. 7B. In some embodiments, source/drain material or regions 360 can be formed using any suitable techniques, such as epitaxially growing the semiconductor material included in the regions 360 from the top surface of substrate 300 and/or from the exposed outer portions of channel material layers 312, for example. For instance, in embodiments where the top surface of substrate 300 does not include monocrystalline semiconductor material, the source/drain material 360 may only significantly grow from the exposed outer portions of channel material layers 312.

In some embodiments, optional processing may occur before forming source/drain material 360, such as converting the top surface of substrate 300 that is exposed in the source/drain trenches 340 of FIG. 6A to electrical insulator material, or leaving a portion of the inner spacer material 350 on the bottom of the source/drain trenches 340 to cover the exposed top surface of substrate 300, or doping the top surface of substrate 300 with opposite-type dopant (n-type versus p-type) relative to the source/drain material 360 to create a p-n junction for electrical isolation purposes, or any other suitable processing as can be understood based on this disclosure to electrically and/or physically isolate the source/drain material 360 from substrate 300. In some embodiments, substrate 300 has a semiconductor-on-insulator structure (e.g., an SOI structure), such that the exposed top surface of substrate 300 is already electrical insulator material (e.g., an oxide) that provides electrical isolation.

Source/drain regions 360, in some embodiments, include semiconductor material. In some such embodiments, source/drain regions 360 include group IV and/or group III-V semiconductor material. This, in some embodiments, source/drain regions 360 include one or more of silicon, germanium, tin, carbon, indium, gallium, aluminum, arsenic, nitrogen, phosphorous, arsenic, or antimony. In some embodiments, source/drain regions 360 include the same group-type of semiconductor material that channel material layers 312 include. For instance, in some such embodiments where channel material layers 312 include group IV semiconductor material (e.g., Si, SiGe, Ge), source/drain regions 360 also include group IV semiconductor material. Further, in some embodiments where channel material layers 312 include group III-V semiconductor material (e.g., GaAs, InGaAs, InP), source/drain regions 360 also include group III-V semiconductor material. However, in other embodiments, one of channel material layers 312 or source/drain regions 360 include group IV semiconductor material, and the other of channel material layers 312 or source/drain regions 360 include group III-V semiconductor material. In an example embodiment, source/drain regions 360 include semiconductor material that includes germanium (e.g., in a concentration in the range of 1-100 atomic percent), which may or may not also include silicon (e.g., such that the semiconductor material is either Ge or SiGe). In another example embodiment, source/drain regions 360 include gallium and arsenic, which may or may not also include indium (e.g., such that the semiconductor material is either GaAs or InGaAs).

In some embodiments, the source/drain regions 360 include the same semiconductor material as one another (e.g., where they are processed simultaneously), while in other embodiments, the source/drain regions 360 include compositionally distinct semiconductor material from one another (e.g., where they are processed separately using masking techniques). Further, in some embodiments, the semiconductor material included in source/drain regions 360 includes dopant, such as n-type and/or p-type dopant. For instance, in some embodiments, both source/drain regions 360 for an active device include n-type dopant (e.g., in an NMOS device), while in other embodiments, both source/drain regions 360 for an active device include p-type dopant (e.g., in a PMOS device). In still other embodiments, one of the source/drain regions 360 for an active device includes n-type dopant, while the other of the source/drain regions 360 for the active device includes p-type dopant, such as in a configuration that employs quantum tunneling (e.g., in a TFET device).

In some embodiments, one or more of source/drain regions 360 include a multilayer structure that includes at least two compositionally distinct material layers or portions. For instance, in some such embodiments employing a multilayer source/drain region, there may be a first portion nearest channel material layers 312 and a second portion nearest source/drain contact structure 390, where the first and second portions include compositionally different materials. For example, the second portion may include a relatively higher amount of dopant than the second portion, which may help prevent diffusion of undesired dopant into the adjacent channel material layers 312 and/or help reduce contact resistance. In another example, the first portion includes a first semiconductor material and the second portion includes a second semiconductor material different form the first semiconductor material. For instance, the first portion may include Si or SiGe with a relatively low Ge concentration (e.g., 0-30 atomic percent), while the second portion may include SiGe or Ge with a relatively high Ge concentration (e.g., 30-100 atomic percent). In some embodiments, one or more of source/drain regions 360 include grading (e.g., increasing and/or decreasing) of the concentration of one or more materials within the feature. For example, the atomic percent concentration of a semiconductor compound can be graded or changed throughout at least a portion of a source/drain region 360, such as the concentration of Ge or In in the region. In another example, the concentration of dopant is graded in a source/drain region 360, such as having the concentration be relatively lower near channel material layers 312 and relatively higher near the corresponding source/drain contact structure 390. This can be achieved by tuning the amount of dopant in the reactant flow (e.g., during an in-situ doping scheme), for example. Further, such a graded configuration can help prevent diffusion of undesired dopant into the channel material layers 312 and/or help reduce contact resistance, for example.

Method 200 of FIG. 2 continues with processing 212 the dummy channel region to change the channel material layers in that dummy region for electrical isolation purposes, in accordance with some embodiments. For instance, FIG. 8A illustrates the view of FIG. 7A after the middle dummy gate structure 320 (as well as corresponding optional hardmask 322) was removed to form trench 342 for the dummy channel region, and the sacrificial layers 311 in trench 342 were also removed, in accordance with some embodiments. FIG. 8B illustrates an example cross-sectional view along dashed line 8B shown in FIG. 8A, in accordance with some embodiments. Note that the cross-sectional view of FIG. 8A corresponds to the view taken along dashed line 8A in FIG. 8B. As can be understood based on this disclosure, trench 342 exposes the dummy channel region that is to be changed for electrical isolation purposes, in this example embodiment. The dummy channel region is referred to as such herein because although it includes channel material layers 312 as shown, the channel material layers 312 exposed by trench 342 will not be used as the channel region for an active device, but are instead to be changed for electrical isolation purposes, as variously described herein.

In some embodiments, a dielectric layer 370, which may be considered an interlayer dielectric (ILD) layer is formed over the source/drain regions 360 such as is shown in FIG. 8A to protect the source/drain regions 360 during subsequent processing, for example. In some such embodiments, the dielectric layer 370 includes one or more dielectrics, such as one or more oxides (e.g., silicon dioxide), nitrides (e.g., silicon nitride), high-k dielectrics, low-k dielectrics, and/or any other suitable electrically insulating material as can be understood based on this disclosure. In some embodiments, dielectric layer 370 includes silicon, oxygen, nitrogen, and/or carbon. For instance, in some embodiments, dielectric layer 370 includes silicon dioxide, silicon monoxide, silicon nitride, silicon oxynitride, or carbon-doped silicon dioxide (or other carbon-doped oxides). In some embodiments, it is desired to select material for dielectric layer 370 that has a low dielectric constant and a high breakdown voltage. In some embodiments, to decrease dielectric constant, dielectric layer 370 is formed to be intentionally porous, such as including at least one porous carbon-doped oxide (e.g., porous carbon-doped silicon dioxide). In embodiments where dielectric layer 370 is porous, it includes a plurality of pores throughout at least a portion of the layer. In some embodiments, dielectric layer 370 includes a multilayer structure.

In some embodiments, optional hard mask 322 and dummy gate structure 320 are removed using any suitable techniques, such as by etching the materials to remove them and expose the underlying portion of multilayer stack 310 in trench 342, for example. After the portion of the multilayer stack 310 is exposed by trench 342, sacrificial layers 311 can be (at least partially) removed via selective etch processing (e.g., using a given etchant that removes the material of layers 311 selective to the material of layers 312), thereby achieving the resulting example structures of FIGS. 8A and 8B. Note that although sacrificial layers 311 are shown as having been completely removed in this example embodiment, in other embodiments, a remnant of one or more of sacrificial layers 311 remains. In addition, in some embodiments, the processing may change the shape of channel material layers 312 in trench 342, even though they are depicted as still having their original shape in FIGS. 8A and 8B.

The processing 212 of the dummy channel region exposed in trench 342 continues with changing the channel material layers 312 in that dummy channel region for electrical isolation purposes, in accordance with some embodiments. For instance, FIG. 9A illustrates the view of FIG. 8A after the channel material layers 312 in the dummy channel region exposed by trench 342 have been changed for electrical isolation purposes to isolation layers or bodies 315, in accordance with some embodiments. FIG. 9B illustrates an example cross-sectional view along dashed line 9B shown in FIG. 9A, in accordance with some embodiments. Note that the cross-sectional view of FIG. 9A corresponds to the view taken along dashed line 9A in FIG. 9B. In some embodiments, the channel material layers 312 in the dummy channel region exposed by trench 342, which include semiconductor material, can be changed by converting them to an electrical insulator and/or by adding dopant that is opposite in type relative to surrounding source/drain material 360. Recall that although there are two channel material layers 312 in the dummy channel region exposed by trench 342, the present disclosure is not intended to be so limited. For instance, in some embodiments, 1, 2, 3, 4, 5, 6, 7, 8, 9, 10, or more channel material layers 312 may be present that are changed for electrical isolation purposes. Also note that isolation layers or bodies 315, in some cases, are considered nanowires or nanoribbons, as can be understood based on this disclosure.

In some embodiments, channel material layers 312 in the dummy channel region exposed by trench 342 are changed by converting the semiconductor material of those layers 312 to electrical insulator material. In some such embodiments, the conversion from semiconductor material to insulator material can be achieved by oxidizing and/or nitridizing the exposed channel material layers 312 to form isolation layers or bodies 315. For instance, in some embodiments, the semiconductor layers 312 are oxidized and/or nitridized such that oxygen and/or nitrogen is added to the layers to at least partially convert them to insulator material. The oxidizing and/or nitridizing may be achieved via thermal and/or catalytic processes, such as thermal oxidation/nitridation and/or catalytic oxidation/nitridation, for example. In some such embodiments, the conversion of the channel material layers 312 in the dummy channel region to electrical insulator material can be detected based on the presence of oxygen and/or nitrogen in the resulting isolation bodies 315 that would not otherwise be present (e.g., that is not present in the channel material layers 312 of a neighboring active device). For instance, if the channel material layers 312 originally included silicon germanium ($Si_xGe_{1-x}$) and oxidation processing occurred to convert them to an electrical insulator, the result would be that the isolation layers 315 would include oxygen, such as in the form of $Si_xGe_{1-x}O_y$, for example.

Detection of the conversion may also be based on the presence of catalysts in the trench 342 of the dummy channel region that were used for a catalytic process (where employed), such as a catalytic oxidation process. For example, if aluminum and oxygen, such as in the form of aluminum oxide or alumina ($Al_2O_3$), were used as a catalyst to oxidize the exposed channel material layers 312 of the dummy channel region, then the aluminum from the catalyst may remain in trench 342 that would otherwise not have been present. Other catalysts include other various oxides, such as oxygen combined with one or more of titanium (e.g., as titanium oxide or titanium dioxide), hafnium (e.g., as hafnium oxide or hafnia), ruthenium (e.g., as ruthenium oxide), vanadium (e.g., as vanadium oxide, vanadium dioxide, vanadium trioxide, or vanadium pentoxide), scandium (e.g., as scandium oxide or scandia), and magnesium (e.g., as magnesium oxide or magnesia), to provide some additional examples. Thus, the presence of at least the non-oxygen component of an oxide catalyst may remain in the trench 342 of the dummy channel region, where a catalytic process is employed, and detection of that material can indicate use of the techniques described herein, in accordance with some embodiments.

In some embodiments, channel material layers 312 in the dummy channel region exposed by trench 342 are changed by implanting dopant into those channel material layers 312 to create p-n junctions with one or both of the adjacent source/drain regions 360. In other words, if at least one of the adjacent source/drain regions 360 (which would be one of the middle two regions 360, in the example structure of FIG. 9A) includes p-type dopant (e.g., for PMOS devices, such as if transistor devices 10 and 20 were PMOS devices), then n-type dopant can be added to the semiconductor material included in the channel material layers 312 of the dummy channel region to form isolation layers or bodies 315 and thereby create a p-n junction, in accordance with some embodiments. Vice versa, if at least one of the adjacent source/drain regions 360 (which would be one of the middle two regions 360, in the example structure of FIG. 9A) includes n-type dopant (e.g., for NMOS devices, such as if transistor devices 10 and 20 were NMOS devices), then p-type dopant can be added to the semiconductor material included in the channel material layers 312 of the dummy channel region to form isolation layers or bodies 315 and thereby create a p-n junction, in accordance with some embodiments. In some embodiments, opposite-type dopant relative to at least one adjacent source/drain region 360 is added to the channel material layers 312 of the dummy channel region via implantation and/or diffusion processing. In some embodiments, the opposite-type dopant relative to at least one adjacent source/drain region 360 added to the channel material layers 312 of the dummy channel region to change them to isolation layers/bodies 315 is at a concentration in the range of 2E18-1E21 atoms per cubic cm, for example. In some embodiments, the opposite-type dopant relative to at least one adjacent source/drain region 360 added to the channel material layers 312 of the dummy channel region to change them to isolation layers/bodies 315 is at a concentration of at least 2E18, 5E18, 1E19, 5E19, 1E20, 5E20, or 1E21 atoms per cubic cm, for example.

Note that isolation layers or bodies 315 (which may also be considered nanowires or nanoribbons) are shaded with a gradient fill, because in some embodiments, the oxygen and/or nitrogen that is added to those bodies 315 and/or the dopant added to those bodies 315 is included at relatively higher concentrations on the outside of those bodies 315 and decreases in a graded manner toward the center of the bodies 315, as such processing would be performed around those bodies after they were exposed as shown in FIGS. 8A and 8B. In other words, in some such embodiments, detection of the techniques described herein can be based on a gradient of oxygen/nitrogen and/or dopant from the outer surface of the bodies 315 (e.g., around the outside of the bodies in the view shown in FIG. 9B) to the center of the bodies 315. However, the present disclosure is not intended to be so limited, and in some embodiments, the added oxygen/nitrogen and/or dopant is distributed throughout each body 315 in a different manner (e.g., evenly or randomly). In embodiments where isolation bodies 315 are formed by implanting/diffusing dopant into the bodies, that dopant may be included in a concentration of at least 2E18 atoms per cubic cm (e.g., 2E18-1E21 atoms per cubic cm), and any dopant included in the channel material bodies 312 of an adjacent active device may be included in a concentration of less than 2E18 atoms per cubic cm (e.g., 0-1E18 atoms per cubic cm), for example.

The processing 212 of the dummy channel region continues with forming an isolation structure in trench 342, in accordance with some embodiments. For instance, FIG. 10A illustrates the view of FIG. 9A after the isolation structure 380 has been formed in dummy channel region trench 342, in accordance with some embodiments. FIG. 10B illustrates an example cross-sectional view along dashed line 10B shown in FIG. 10A, in accordance with some embodiments. Note that the cross-sectional view of FIG. 10A corresponds to the view taken along dashed line 10A in FIG. 10B. In some embodiments, isolation structure 380 are formed using any suitable techniques, such as depositing the material of the isolation structure 380 in trench 342, for example. As can be understood based on this disclosure, as isolation structure 380 is formed in trench 342, such that it wraps around isolation bodies 315, it is replacing where a final gate would have been formed. Thus, in some embodiments, isolation structure 380 is a dielectric structure. However, in other embodiments, isolation structure 380 is the same as the final gate structures described herein (including final gate dielectric 334 and final gate electrode 336), which may be formed when all other final gates are formed. In some such embodiments, that final gate structure for the dummy channel region including bodies 315 would not be electrically interconnected during back-end processing, such that the final gate structure formed as isolation structure 380 would be a floating metal gate.

As stated above, in some embodiments, isolation structure 380 includes dielectric material, such as any suitable oxide (e.g., silicon dioxide), nitride (e.g., silicon nitride), high-k dielectric, low-k dielectric, and/or any other suitable electrically insulating material as can be understood based on this disclosure. In some such embodiments, isolation structure 380 includes silicon, oxygen, nitrogen, and/or carbon. For instance, in some embodiments, isolation structure 380 includes silicon dioxide, silicon monoxide, silicon nitride, silicon oxynitride, or carbon-doped silicon dioxide (or other carbon-doped oxides). In some embodiments, isolation structure 380 may include the same material as gate spacers 332 and/or inner spacers 350, while in other embodiments isolation structure 380 includes different material relative to both gate spacers 332 and inner spacers 350. As was also stated above, in some embodiments, isolation structure 380 is a floating metal gate structure, such that it includes one or more metals. In some embodiments, detection of the techniques and structures described herein can be based on the presence of isolation structure 380 (e.g., instead of there being a final gate structure at that location).

Figure 11B:
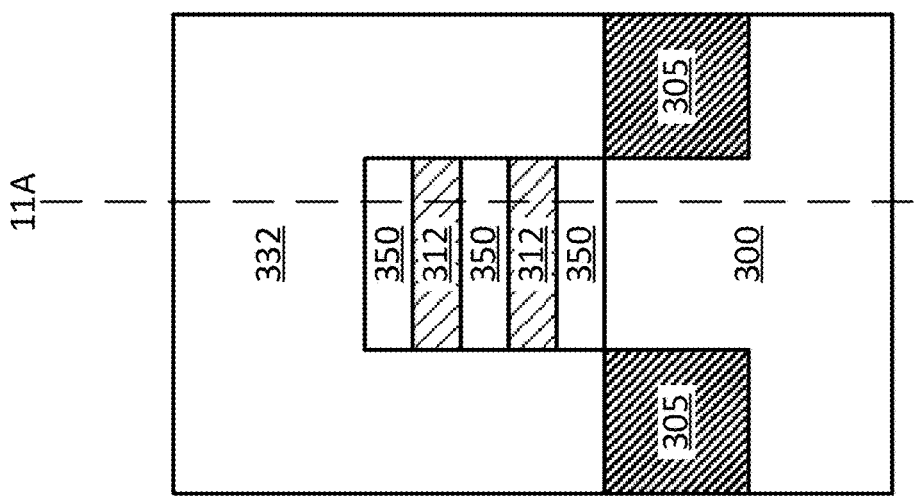
FIG. 11B illustrates an example cross-sectional view along dashed line 11B shown in FIG. 11A, in accordance with some embodiments. Note that the cross-sectional view of FIG. 11A corresponds to the view taken along dashed line 11A in FIG. 11B.
Figure 11A:
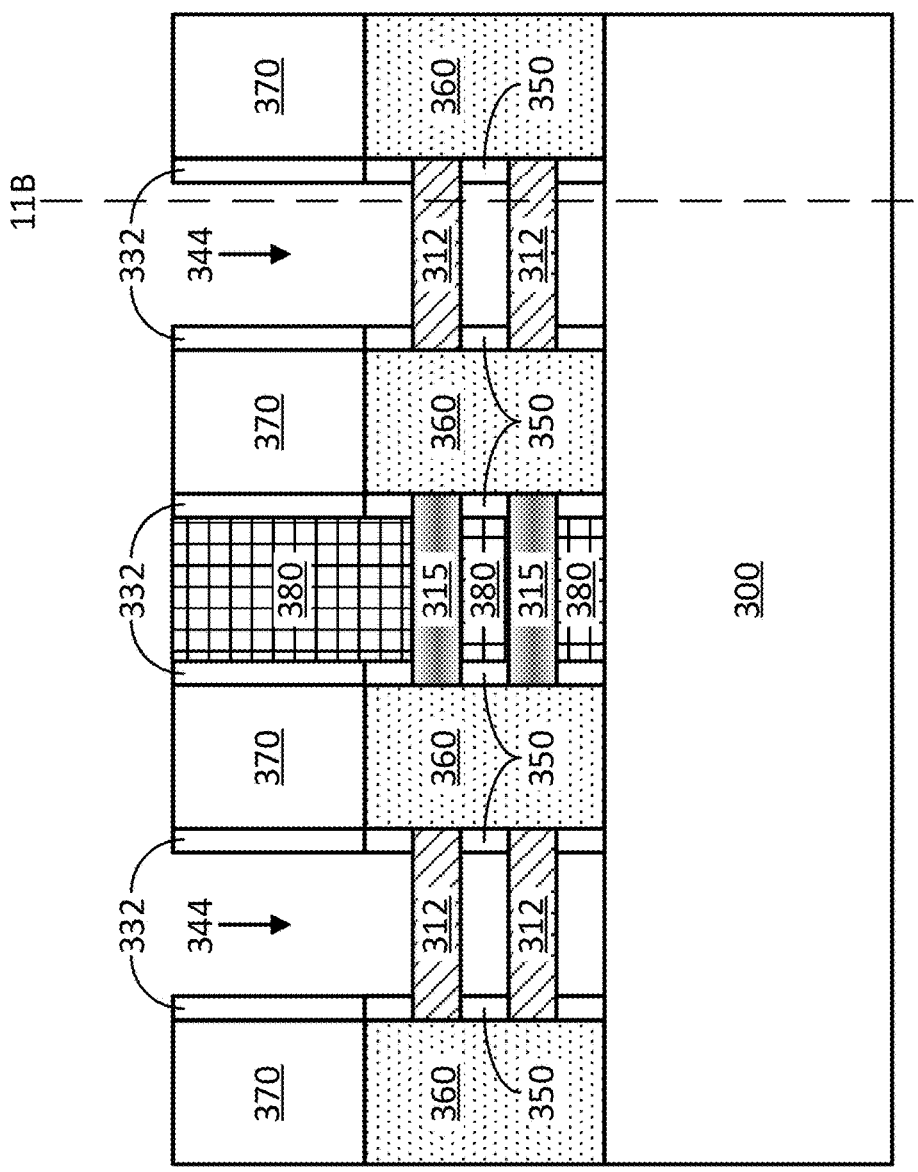
FIG. 11A illustrates the view of FIG. 10A after the other dummy gate structures (as well as corresponding optional hardmasks) were removed to form trenches for the active channel regions, and the sacrificial layers in those trenches were also removed, in accordance with some embodiments.

Method 200 of FIG. 2 continues with forming 214 the final gate structures, in accordance with some embodiments. For instance, FIG. 11A illustrates the view of FIG. 10A after the other dummy gate structures 320 (as well as corresponding optional hardmasks 322) were removed to form trenches 344 for the active channel regions, and the sacrificial layers 311 in trenches 344 were also removed, in accordance with some embodiments. FIG. 11B illustrates an example cross-sectional view along dashed line 11B shown in FIG. 11A, in accordance with some embodiments. Note that the cross-sectional view of FIG. 11A corresponds to the view taken along dashed line 11A in FIG. 11B. As can be understood based on this disclosure, trenches 344 expose multilayer stack 310 in the active channel regions that are to be used for transistor devices, in this example embodiment.

In some embodiments, optional hard mask 322 and dummy gate structure 320 are removed using any suitable techniques, such as by etching the materials to remove them and expose the underlying portion of multilayer stack 310 in trenches 344, for example. After the portions of the multilayer stack 310 are exposed by trenches 344, sacrificial layers 311 can be (at least partially) removed via selective etch processing (e.g., using a given etchant that removes the material of layers 311 selective to the material of layers 312), thereby achieving the resulting example structures of FIGS. 11A and 11B. Note that although sacrificial layers 311 are shown as having been completely removed in this example embodiment, in other embodiments, a remnant of one or more of sacrificial layers 311 remains. In addition, in some embodiments, the processing may change the shape of channel material layers 312 in trenches 344, even though they are depicted as still having their original shape in FIGS. 8A and 8B. Recall that although there are two channel material layers 312 in the active channel regions exposed by trenches 344, the present disclosure is not intended to be so limited. For instance, in some embodiments, 1, 2, 3, 4, 5, 6, 7, 8, 9, 10, or more channel material layers 312 may be present in each active channel region. Also note that the channel material layers 312 in the active channel regions (e.g., in trenches 344) may also be referred to herein as bodies, nanowires, or nanoribbons, as can be understood based on this disclosure.

Figure 12B:
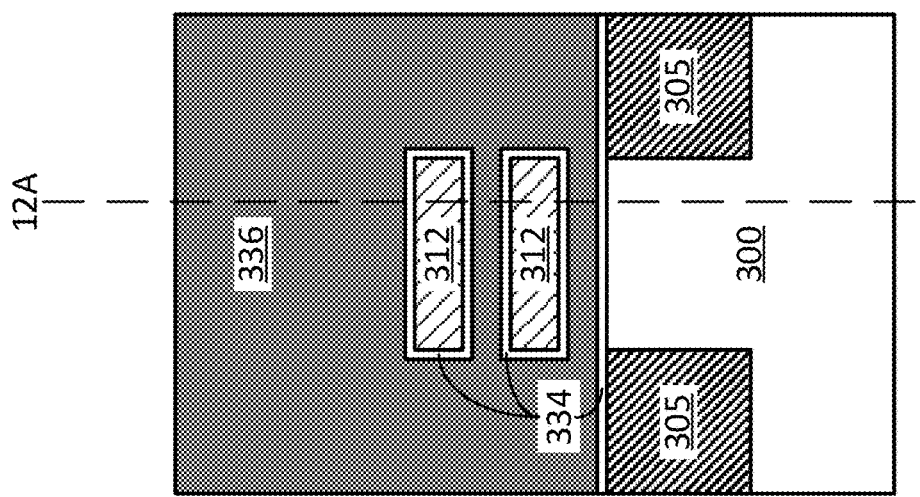
FIG. 12B illustrates an example cross-sectional view along dashed line 12B shown in FIG. 12A, in accordance with some embodiments. Note that the cross-sectional view of FIG. 12A corresponds to the view taken along dashed line 12A in FIG. 12B.
Figure 12B:
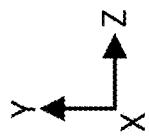
Figure 12A:
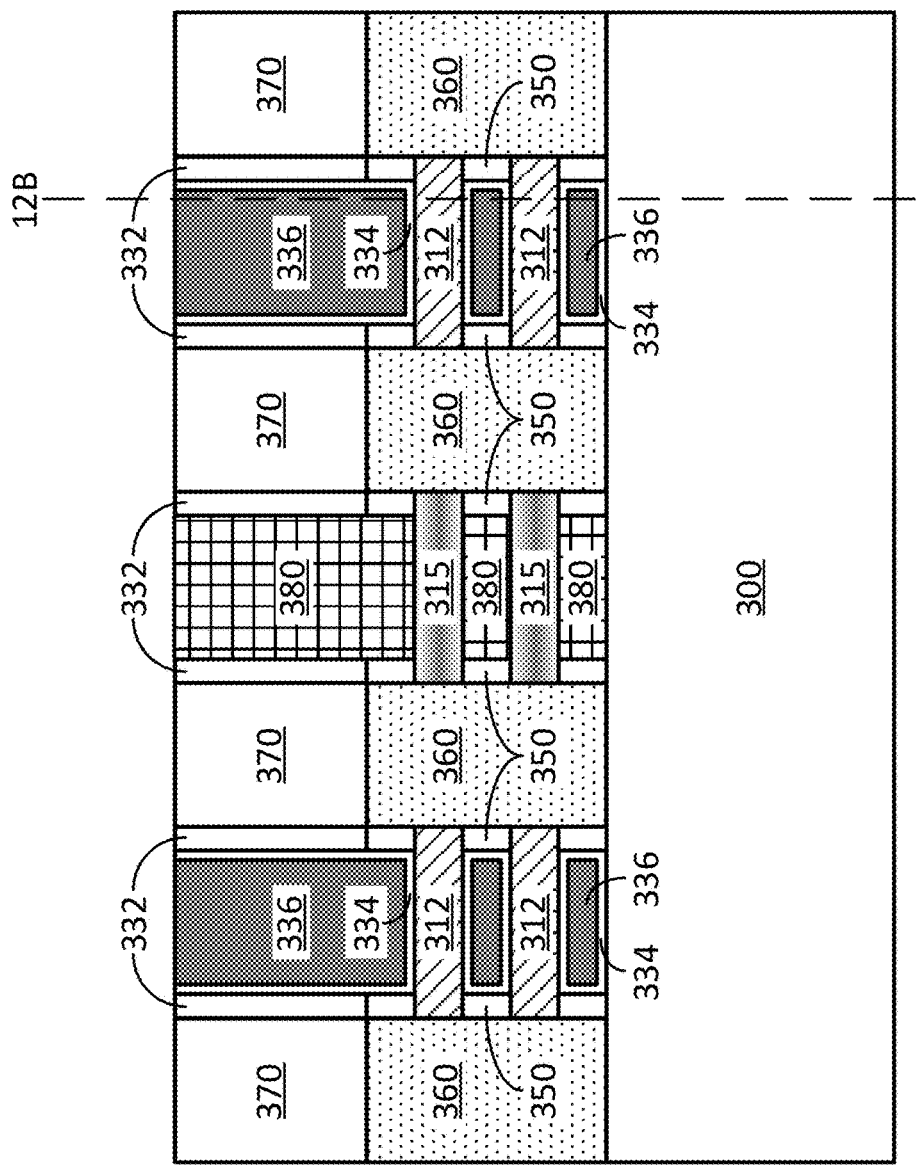
FIG. 12A illustrates the view of FIG. 11A after a final gate structure (including a gate dielectric and a gate electrode) is formed in each of active channel region trenches, in accordance with some embodiments.

Forming 214 the final gate structures in trenches 344 continues with depositing the material of the final gate structures, which each include gate dielectric 334 and gate electrode 336, in accordance with some embodiments. For instance, FIG. 12A illustrates the view of FIG. 11A after a final gate structure (including gate dielectric 334 and gate electrode 336) is formed in each of active channel region trenches 344, in accordance with some embodiments. FIG. 12B illustrates an example cross-sectional view along dashed line 12B shown in FIG. 12A, in accordance with some embodiments. Note that the cross-sectional view of FIG. 12A corresponds to the view taken along dashed line 12A in FIG. 12B.

Gate dielectric 334, in some embodiments, includes one or more dielectrics, such as one or more oxides (e.g., silicon dioxide), nitrides (e.g., silicon nitride), high-k dielectrics, low-k dielectrics, and/or any other suitable material as can be understood based on this disclosure. Examples of high-k dielectrics include, for instance, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate, to provide some examples. Examples of low-k dielectrics include, for instance, fluorine-doped silicon dioxide, carbon-doped silicon dioxide, porous silicon dioxide, porous carbon-doped silicon dioxide, spin-on organic polymeric dielectrics (e.g., polytetrafluoroethylene, benzocyclobutene, polynorbornenes, polyimide), spin-on silicon based polymeric dielectrics (e.g., hydrogen silsesquioxane, methylsilsesquioxane), to provide some examples. In some embodiments, an annealing process is carried out on the gate dielectric 334 to improve its quality when, for example, high-k dielectric material is employed.

In some embodiments, the gate dielectric 334 includes oxygen. In some such embodiments where the gate dielectric 334 includes oxygen, the gate dielectric 334 also includes one or more other materials, such as one or more of hafnium, silicon, lanthanum, aluminum, zirconium, tantalum, titanium, barium, strontium, yttrium, lead, scandium, zinc, lithium, or niobium. For instance, the gate dielectric 334 may include hafnium and oxygen (e.g., in the form of hafnium oxide or hafnium silicon oxide), or the gate dielectric 334 may include silicon and oxygen (e.g., in the form of silicon dioxide, hafnium silicon oxide, or zirconium silicon oxide), in accordance with some embodiments. In some embodiments, the gate dielectric 334 includes nitrogen. In some such embodiments where the gate dielectric 334 includes nitrogen, the gate dielectric 334 may also include one or more other materials, such as silicon (e.g., silicon nitride) for instance. In some embodiments, the gate dielectric 334 includes silicon and oxygen, such as in the form of one or more silicates (e.g., titanium silicate, tungsten silicate, niobium silicate, and silicates of other transition metals). In some embodiments, the gate dielectric 334 includes oxygen and nitrogen (e.g., silicon oxynitride or aluminum oxynitride).

In some embodiments, the gate dielectric 334 includes a multilayer structure, including two or more compositionally distinct layers. For example, a multilayer gate dielectric can be employed to obtain desired electrical isolation and/or to help transition from each channel material layer or body 312 to gate electrode 336, in accordance with some embodiments. In an example embodiment, a multilayer gate dielectric has a first layer nearest each body 312 that includes oxygen and one or more materials included in each body 312 (such as silicon and/or germanium), which may be in the form of an oxide (e.g., silicon dioxide or germanium oxide), and the multilayer gate dielectric also has a second layer farthest from each body 312 (and nearest the gate electrode 336) that includes at least one high-k dielectric (e.g., hafnium and oxygen, which may be in the form of hafnium oxide or hafnium silicon oxide). In some embodiments, gate dielectric 334 includes grading (e.g., increasing and/or decreasing) the content/concentration of one or more materials through at least a portion of the gate dielectric, such as the oxygen content/concentration within the gate dielectric 334.

In some embodiments, gate dielectric 334 has a thickness in the range of 1-30 nm (or in a sub-range of 1-5, 1-10, 1-15, 1-20, 1-25, 2-5, 2-10, 2-15, 2-20, 2-25, 2-30, 3-8, 3-12, 5-10, 5-15, 5-20, 5-25, 5-30, 10-20, 10-30, or 20-30 nm) or greater, for example, or within any other suitable range or having any other suitable value as can be understood based on this disclosure. In some embodiments, the thickness of gate dielectric 334 is at least 1, 2, 3, 5, 10, 15, 20, or 25 nm, and/or at most 30, 25, 20, 15, 10, 8, or 5 nm, for example. Note that the thicknesses described herein for gate dielectric 334 relate at least to the dimension between each body 312 and gate electrode 336 (e.g., at least the dimension in the Y-axis). In some embodiments, the thickness of gate dielectric 334 is selected, at least in part, based on the desired amount of isolation between each channel material body 312 and gate electrode 336. In some embodiments, gate dielectric 334 provides means for electrically insulating each channel material layer/body 312 from gate electrode 336. In some embodiments, the characteristics of gate dielectric 334 are selected based on desired electrical properties.

Gate electrode 336, in some embodiments, includes one or more metals, such as one or more of aluminum, tungsten, titanium, tantalum, copper, nickel, gold, platinum, ruthenium, or cobalt, for example. In some embodiments, gate electrode 336 includes carbon and/or nitrogen, such as in combination with one or more of the metals in the preceding sentence, for example. For instance, in some embodiments gate electrode 336 includes titanium and nitrogen (e.g., titanium nitride), or tantalum and nitrogen (e.g., tantalum nitride), such as in a liner layer that is in direct contact with the gate dielectric, for example. Thus, in some embodiments, gate electrode 336 includes one or more metals that may or may not include one or more other materials (such as carbon and/or nitrogen). In some embodiments, gate electrode 336 includes a multilayer structure, including two or more compositionally distinct layers. For instance, in some such embodiments, one or more work function layers are employed, such as one or more metal-including layers that are formed with desired electrical characteristics. Further, in some such embodiments, the one or more metal-including layers include tantalum and/or titanium, which may also include nitrogen (e.g., in the form of tantalum nitride or titanium nitride). In some embodiments, a bulk metal structure is formed on and between a conformal layer (such as a liner layer), where the bulk metal structure includes compositionally distinct material from the conformal/liner layer.

In some embodiments, gate electrode 336 includes a resistance reducing metal layer between a bulk metal structure and the gate dielectric, for instance. Example resistance reducing metals include, for instance one or more of nickel, titanium, titanium with nitrogen (e.g., titanium nitride), tantalum, tantalum with nitrogen (e.g., tantalum nitride), cobalt, gold, gold with germanium (e.g., gold-germanium), nickel, platinum, nickel with platinum (e.g., nickel-platinum), aluminum, and/or nickel with aluminum (e.g., nickel aluminum), for instance. Example bulk metal structures include one or more of aluminum, tungsten, ruthenium, copper, or cobalt, for instance. In some embodiments, gate electrode 336 includes additional layers, such as one or more layers including titanium and nitrogen (e.g., titanium nitride) and/or tantalum and nitrogen (e.g., tantalum nitride), which can be used for adhesion and/or liner/barrier purposes, for example. In some embodiments, the thickness, material, and/or deposition process of sub-layers within a multilayer gate electrode are selected based on a target application, such as whether the gate electrode is to be used with an n-channel device or a p-channel device. In some embodiments, the gate electrode 336 provides means for changing the electrical attributes of each adjacent channel material layer/body 312 when a voltage is applied to the gate electrode 336.

In some embodiments, gate electrode 336 has a thickness (dimension in the Y-axis direction in the view of FIGS. 12A and 12B) in the range of 10-100 nm (or in a sub-range of 10-25, 10-50, 10-75, 20-30, 20-50, 20-75, 20-100, 30-50, 30-75, 30-100, 50-75, or 50-100 nm) or greater, for example, or within any other suitable range or having any other suitable value as can be understood based on this disclosure. In an embodiment, gate electrode 336 has a thickness that falls within the sub-range of 20-40 nm. In some embodiments, gate electrode has a thickness of at least 10, 15, 20, 25, 30, 40, or 50 nm and/or at most 100, 50, 40, 30, 25, or 20 nm, for example. In some embodiments, gate electrode 336 includes grading (e.g., increasing and/or decreasing) the content/concentration of one or more materials through at least a portion of the structure.

Figure 13B:
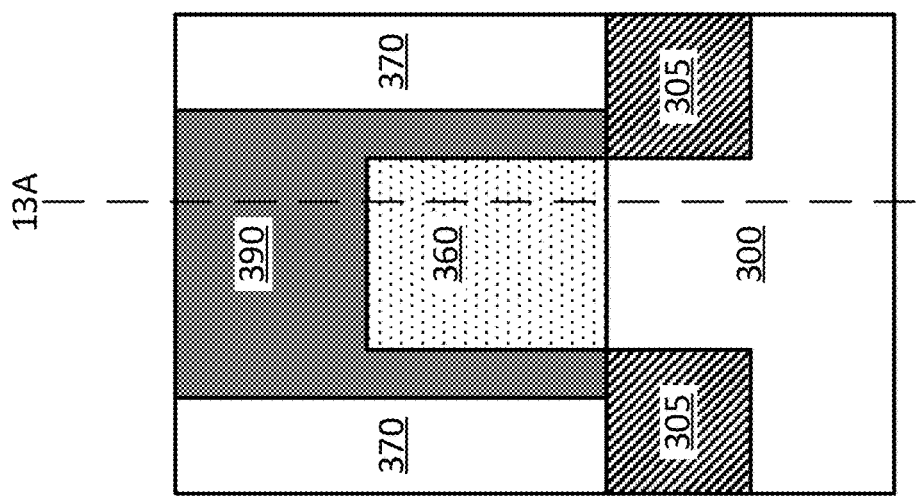
FIG. 13B illustrates an example cross-sectional view along dashed line 13B shown in FIG. 13A, in accordance with some embodiments. Note that the cross-sectional view of FIG. 13A corresponds to the view taken along dashed line 13A in FIG. 13B.
Figure 13B:
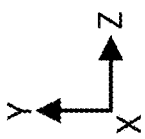
Figure 13A:
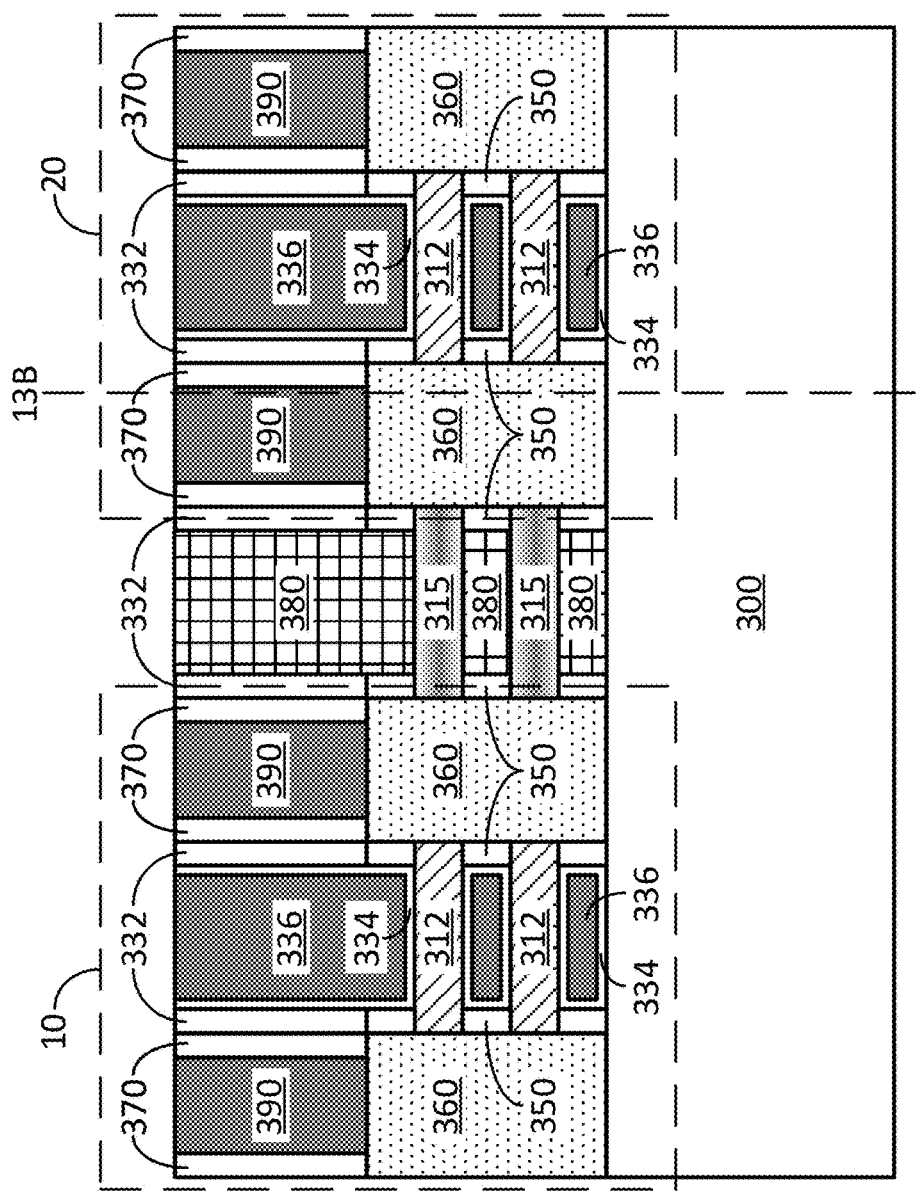
FIG. 13A illustrates the view of FIG. 12A after source/drain contact structures have been formed, in accordance with some embodiments.
Figure 13A:
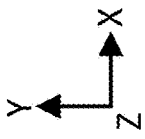

Method 200 of FIG. 2 continues with forming 216 source/drain contact structures, in accordance with some embodiments. For instance, FIG. 13A illustrates the view of FIG. 12A after source/drain contact structures 390 have been formed, in accordance with some embodiments. FIG. 13B illustrates an example cross-sectional view along dashed line 13B shown in FIG. 13A, in accordance with some embodiments. Note that the cross-sectional view of FIG. 13A corresponds to the view taken along dashed line 13A in FIG. 13B. In some embodiments, the source/drain contact structure formation 216 includes forming source/drain contact trenches in dielectric or ILD layer 370 via etch processing in which the source/drain contact structures 390 can be formed. In some such embodiments, a portion of dielectric layer 370 remains between gate spacers 332, such as is shown in FIG. 13A. However, in other embodiments, dielectric or ILD layer 370 is completely removed between gate spacers 332 and above source/drain contact structures 390.

Source/drain contact structures 390, in some embodiments, include one or more metals. For instance, one or both of source/drain contact structures may include a resistance reducing metal and a contact plug metal, or just a contact plug, for instance. Example contact resistance reducing metals include, for instance, nickel, titanium, titanium with nitrogen (e.g., in the form of titanium nitride), tantalum, tantalum with nitrogen (e.g., in the form of tantalum nitride), cobalt, gold, gold-germanium, nickel-platinum, nickel aluminum, and/or other such resistance reducing metals or alloys. Example contact plug metals include, for instance, aluminum, tungsten, ruthenium, or cobalt, although any suitable conductive material could be employed. In some embodiments, additional layers are present in the source/drain contact trenches, where such additional layers would be a part of the source/drain contact structures 390. Examples of additional layers include adhesion layers and/or liner/barrier layers, that include, for example, titanium, titanium with nitrogen (e.g., in the form of titanium nitride), tantalum, and/or tantalum with nitrogen (e.g., in the form of tantalum nitride). Another example of an additional layer is a contact resistance reducing layer between a given source/drain region 360 and its corresponding source/drain contact structure 390, where the contact resistance reducing layer includes semiconductor material and relatively high dopant (e.g., with dopant concentrations greater than 1E19, 1E20, 1E21, 5E21, or 1E22 atoms per cubic cm), for example.

Method 200 of FIG. 2 continues with completing 218 integrated circuit processing, as desired, in accordance with some embodiments. Such additional processing to complete the integrated circuit can include back-end or back-end-of-line (BEOL) processing to form one or more metallization layers and/or to interconnect the devices formed during the front-end or front-end-of-line (FEOL) processing, such as the transistor devices described herein. As shown in FIG. 13A, the integrated circuit structure includes two active transistor devices 10 and 20, that are electrically isolated by isolation bodies 315, as can be understood based on this disclosure. Note that the processes 202-218 of method 200 are shown in a particular order for ease of description, in accordance with some embodiments. However, in some embodiments, one or more of the processes 202-218 are performed in a different order and/or additional processes not shown are performed, as can be understood based on this disclosure. For example, box 214 may be performed prior to box 212, in an example embodiment. Numerous variations on method 200 and the techniques described herein will be apparent in light of this disclosure.

Returning to the example structures of FIGS. 10B and 12B, note that although isolation bodies 315 and channel material bodies 312 are shown respectively in those figures as having a shape that is a rectangle or sheet, the present disclosure is not intended to be so limited. In some embodiments, the bodies 312 and 315, which may be nanowires and/or nanoribbons, could employ various different shapes, such as a circle, oval, ellipse, square, rectangle, sheet, fin, or any other shape as can be understood based on this disclosure. Regardless of the shape, the isolation structure 380 would still wrap around the isolation bodies 315 (such as is shown in FIG. 10B) and the final gate structure (including gate dielectric 334 and gate electrode 336) would still wrap around the channel material bodies 312 (such as is shown in FIG. 12B). Numerous variations and configurations will be apparent in light of this disclosure.

Example System

Figure 14:
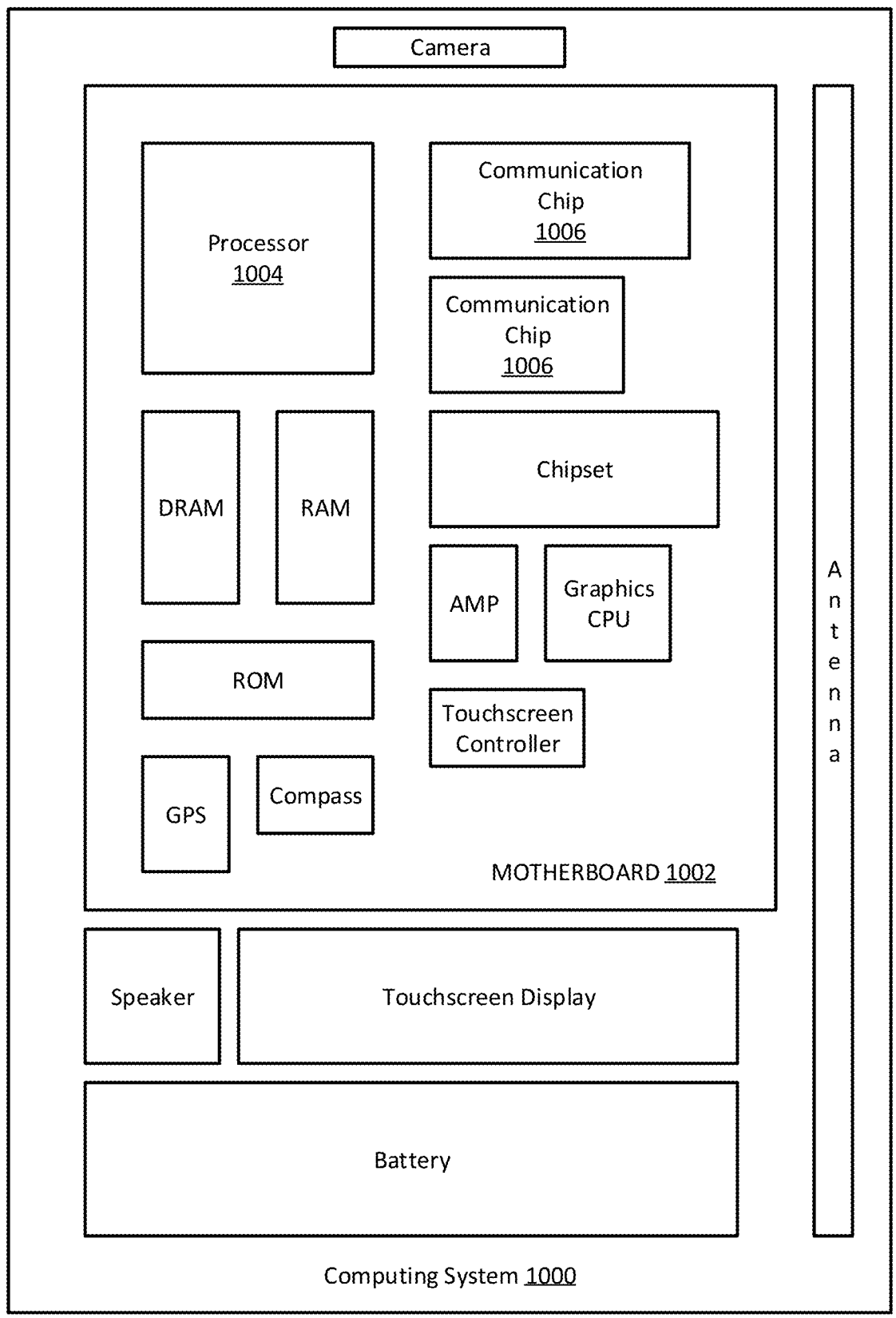
FIG. 14 illustrates a computing system implemented with integrated circuit structures including at least one gate-all-around (GAA) transistor device employing one or more isolation schemes as variously disclosed herein, in accordance with some embodiments.

FIG. 14 illustrates a computing system 1000 implemented with integrated circuit structures including at least one gate-all-around (GAA) transistor device employing one or more isolation schemes as variously disclosed herein, in accordance with some embodiments. For example, the integrated circuit structures disclosed herein can be included in one or more portions of computing system 1000. As can be seen, the computing system 1000 houses a motherboard 1002. The motherboard 1002 can include a number of components, including, but not limited to, a processor 1004 and at least one communication chip 1006, each of which can be physically and electrically coupled to the motherboard 1002, or otherwise integrated therein. As will be appreciated, the motherboard 1002 may be, for example, any printed circuit board, whether a main board, a daughterboard mounted on a main board, or the only board of system 1000, etc.

Depending on its applications, computing system 1000 can include one or more other components that may or may not be physically and electrically coupled to the motherboard 1002. These other components can include, but are not limited to, volatile memory (e.g., DRAM or other types of RAM), non-volatile memory (e.g., ROM, ReRAM/RRAM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 1000 can include one or more integrated circuit structures or devices formed using the disclosed techniques in accordance with an example embodiment. In some embodiments, multiple functions can be integrated into one or more chips (e.g., for instance, note that the communication chip 1006 can be part of or otherwise integrated into the processor 1004).

The communication chip 1006 enables wireless communications for the transfer of data to and from the computing system 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 can implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 1000 can include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

The processor 1004 of the computing system 1000 includes an integrated circuit die packaged within the processor 1004. In some embodiments, the integrated circuit die of the processor includes onboard circuitry that is implemented with one or more integrated circuit structures or devices formed using the disclosed techniques, as variously described herein. The term "processor" may refer to any device or portion of a device that processes, for instance, electronic data from registers and/or memory to transform that electronic data into other electronic data that may be stored in registers and/or memory.

The communication chip 1006 also can include an integrated circuit die packaged within the communication chip 1006. In accordance with some such example embodiments, the integrated circuit die of the communication chip includes one or more integrated circuit structures or devices formed using the disclosed techniques as variously described herein. As will be appreciated in light of this disclosure, note that multi-standard wireless capability can be integrated directly into the processor 1004 (e.g., where functionality of any chips 1006 is integrated into processor 1004, rather than having separate communication chips). Further note that processor 1004 can be a chip set having such wireless capability. In short, any number of processor 1004 and/or communication chips 1006 can be used. Likewise, any one chip or chip set can have multiple functions integrated therein.

In various implementations, the computing system 1000 can be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device or system that processes data or employs one or more integrated circuit structures or devices formed using the disclosed techniques, as variously described herein. Note that reference to a computing system is intended to include computing devices, apparatuses, and other structures configured for computing or processing information.

Further Example Embodiments

The following examples pertain to further embodiments, from which numerous permutations and configurations will be apparent.

Example 1 is an integrated circuit including at least one transistor. The integrated circuit includes a first body (or a channel region), a gate structure including a gate dielectric and a gate electrode, a source or drain region (or simply, a region), a second body (or a dummy channel region), and a structure. The first body includes semiconductor material. The gate structure is wrapped around the first body. The gate dielectric is between the gate electrode and the first body. The gate electrode includes one or more metals. The source or drain region includes semiconductor material. The second body is adjacent the source or drain region. In other words, the source or drain region is between the first and second bodies. The structure wraps around the second body. Note that the semiconductor material of the body may be compositionally different from the semiconductor material of the source or drain region, in some embodiments, such as those cases where the source or drain region is an epitaxial source or drain region deposited adjacent the body. In other embodiments, the semiconductor material of the body is the same as the semiconductor material of the source or drain region, such as those cases where the source or drain region is an implantation-doped portion of the body.

Example 2 includes the subject matter of Example 1, wherein the second body includes insulator material that includes oxygen and/or nitrogen. Note that the insulator material is electrical insulator material.

Example 3 includes the subject matter of Example 2, wherein the insulator material included in the second body includes oxygen. In another such example the insulator material included in the second body includes nitrogen. In another such example the insulator material included in the second body includes both oxygen and nitrogen.

Example 4 includes the subject matter of Example 1, wherein the second body includes oxygen.

Example 5 includes the subject matter of Example 1 or 4, wherein the second body includes nitrogen.

Example 6 includes the subject matter of Example 1, 4, or 5, wherein the source or drain region further includes a first dopant, the first dopant being one of n-type or p-type, and the second body includes semiconductor material and a second dopant, the second dopant being the other of n-type or p-type relative to the first dopant.

Example 7 includes the subject matter of Example 6, wherein the second dopant has a concentration of at least 2E18, 5E18, 1E19, 5E19, or 1E20 atoms per cubic centimeter (cm).

Example 8 includes the subject matter of any of Examples 1-7, wherein the first body is a nanowire or a nanoribbon.

Example 9 includes the subject matter of any of Examples 1-8, wherein the second body is a nanowire or a nanoribbon.

Example 10 includes the subject matter of any of Examples 1-9, wherein the structure includes one or more dielectrics.

Example 11 includes the subject matter of any of Examples 1-9, wherein the structure includes a floating metal gate.

Example 12 includes the subject matter of any of Examples 1-11, wherein the gate structure wraps around at least one additional body.

Example 13 includes the subject matter of any of Examples 1-12, wherein the structure wraps around at least one additional body.

Example 14 includes the subject matter of any of Examples 1-13, further comprising a substrate below each of the first body, the source or drain region, and the second body, the substrate including a layer of insulator material.

Example 15 is a complementary metal-oxide-semiconductor (CMOS) circuit including the subject matter of any of Examples 1-14.

Example 16 is a computing system comprising the subject matter of any of Examples 1-15.

Example 17 is a method of forming the subject matter of any of Examples 1-16. The method includes at least forming the first body (or a channel region), forming the gate structure including a gate dielectric and a gate electrode, forming the source or drain region (or simply, a region), forming the second body (or a dummy channel region), and forming the structure.

Example 18 is a method of forming an integrated circuit including at least one transistor, the method including: forming a first body and a second body, the first and second bodies including semiconductor material; forming a gate structure around the first body, the gate structure including a gate electrode and a gate dielectric, the gate dielectric between the gate electrode and the first body, the gate electrode including one or more metals; forming a source or drain region between the first and second bodies, the source or drain region including semiconductor material and a first dopant, the first dopant being one of n-type or p-type dopant; adding, to the second body, one or more of oxygen, nitrogen, or a second dopant that is the other of n-type or p-type relative to the first dopant; and forming a structure around the second body.

Example 19 includes the subject matter of Example 18, wherein adding the one or more of oxygen, nitrogen, or the second dopant to the second body includes a catalytic oxidation process.

Example 20 includes the subject matter of Example 18 or 19, wherein adding the one or more of oxygen, nitrogen, or the second dopant to the second body includes a thermal oxidation process.

Example 21 includes the subject matter of any of Examples 18-20, wherein adding the one or more of oxygen, nitrogen, or the second dopant to the second body includes dopant implantation and/or diffusion.

Example 22 includes the subject matter of any of Examples 18-21, wherein the first and second bodies are formed by removing via selective etch processing one or more sacrificial layers adjacent to each of the first and second bodies.

Example 23 includes the subject matter of any of Examples 1-22, wherein the first body includes strain in the amount of at least 250, 500, 750, 1000, 1250, or 1500 megapascals (MPa).

Example 24 includes the subject matter of Example 23, wherein the strain is tensile strain.

Example 25 includes the subject matter of Example 23, wherein the strain is compressive strain.

The foregoing description of example embodiments has been presented for the purposes of illustration and description. It is not intended to be exhaustive or to limit the present disclosure to the precise forms disclosed. Many modifications and variations are possible in light of this disclosure. It is intended that the scope of the present disclosure be limited not by this detailed description, but rather by the claims appended hereto. Future filed applications claiming priority to this application may claim the disclosed subject matter in a different manner, and may generally include any set of one or more limitations as variously disclosed or otherwise demonstrated herein.

What is claimed is:

1. An integrated circuit including at least one transistor, the integrated circuit comprising:
    a first body including semiconductor material;
    a gate structure wrapped around the first body, the gate structure including a gate electrode and a gate dielectric, the gate dielectric between the gate electrode and the first body, the gate electrode including one or more metals;
    a source or drain region adjacent the body, the source or drain region including semiconductor material;
    a second body adjacent the source or drain region, such that the source or drain region is between the first and second bodies, the second body including insulator material that includes oxygen and/or nitrogen; and
    a structure wrapped around the second body, the structure separate and distinct from the second body.

2. The integrated circuit of claim 1, wherein the first body is a nanowire or a nanoribbon, and the second body is a nanowire or a nanoribbon.

3. The integrated circuit of claim 1, wherein the insulator material included in the second body includes oxygen.

4. The integrated circuit of claim 1, wherein the structure includes one or more dielectrics.

5. The integrated circuit of claim 1, wherein the structure includes a floating metal gate.

6. The integrated circuit of claim 1, wherein the gate structure wraps around at least one additional body.

7. The integrated circuit of claim 1, wherein the structure wraps around at least one additional body.

8. The integrated circuit of claim 1, further comprising a substrate below each of the first body, the source or drain region, and the second body, the substrate including a layer of insulator material.

9. A computing system comprising the integrated circuit of claim 1.

10. An integrated circuit including at least one transistor, the integrated circuit comprising:
    a first body including semiconductor material;
    a gate structure wrapped around the first body, the gate structure including a gate electrode and a gate dielectric, the gate dielectric between the gate electrode and the first body, the gate electrode including one or more metals;

a source or drain region adjacent the body, the source or drain region including semiconductor material and a first dopant, the first dopant being one of n-type or p-type;

a second body adjacent the source or drain region, such that the source or drain region is between the first and second bodies, the second body including semiconductor material and a second dopant, the second dopant being the other of n-type or p-type relative to the first dopant; and a structure wrapped around the second body.

11. The integrated circuit of claim 10, wherein the first body is a nanowire or a nanoribbon, and the second body is a nanowire or a nanoribbon.

12. The integrated circuit of claim 10, wherein the second dopant has a concentration of at least 2E18 atoms per cubic centimeter.

13. The integrated circuit of claim 10, wherein the structure includes one or more dielectrics.

14. The integrated circuit of claim 10, wherein the structure includes a floating metal gate.

15. The integrated circuit of claim 10, wherein the gate structure wraps around at least one additional body.

16. The integrated circuit of claim 10, wherein the structure wraps around at least one additional body.

17. The integrated circuit of claim 10, further comprising a substrate below each of the first body, the source or drain region, and the second body, the substrate including a layer of insulator material.

18. A computing system comprising the integrated circuit of claim 10.

19. A method of forming an integrated circuit including at least one transistor, the method comprising:

forming a first body and a second body, the first and second bodies including semiconductor material;

forming a gate structure around the first body, the gate structure including a gate electrode and a gate dielectric, the gate dielectric between the gate electrode and the first body, the gate electrode including one or more metals;

forming a source or drain region between the first and second bodies, the source or drain region including semiconductor material and a first dopant, the first dopant being one of n-type or p-type;

adding, to the second body, one or more of oxygen, nitrogen, or a second dopant that is the other of n-type or p-type relative to the first dopant; and forming a structure around the second body, the structure separate and distinct from the second body.

20. The method of claim 19, wherein the first and second bodies are formed above a substrate, the substrate including a layer of insulator material.

* * * * *